US012770679B2

(12) United States Patent
Tanaka

(10) Patent No.: US 12,770,679 B2
(45) Date of Patent: Oct. 20, 2026

(54) METHOD, DEVICE, AND CIRCUIT FOR MEMORIES FOR SKIPPING PRE-CHARGING

(71) Applicant: Taiwan Semiconductor Manufacturing Company, Ltd., Hsinchu (TW)

(72) Inventor: Tomotaka Tanaka, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 139 days.

(21) Appl. No.: 18/769,678

(22) Filed: Jul. 11, 2024

(65) Prior Publication Data

US 2025/0292828 A1 Sep. 18, 2025

Related U.S. Application Data

(60) Provisional application No. 63/565,922, filed on Mar. 15, 2024.

(51) Int. Cl.
*G11C 16/04* (2006.01)
*G11C 11/418* (2006.01)

(52) U.S. Cl.
CPC .................................. *G11C 11/418* (2013.01)

(58) Field of Classification Search
CPC .................................................... G11C 11/418
See application file for complete search history.

(56) References Cited

U.S. PATENT DOCUMENTS 9,007,817 B2 4/2015 Chai et al.
11,270,762 B1 * 3/2022 Jung .................... H04M 1/2745
11,461,176 B2 * 10/2022 Park ...................... G11C 7/1018
2017/0110169 A1 * 4/2017 Kim ..................... G06F 13/1689

FOREIGN PATENT DOCUMENTS

KR 10-2008-0072917 A 8/2008
KR 10-2010-0089829 A 8/2010
KR 10-1313101 B1 9/2013
KR 10-2021-0044158 A 4/2021
KR 10-2022-0122845 A 9/2022

(Continued)

OTHER PUBLICATIONS

Office Action issued in Korean Appl. No. 10-2025-0031907 dated Aug. 4, 2025.

(Continued)

*Primary Examiner* — Pho M Luu

(74) *Attorney, Agent, or Firm* — Foley & Lardner LLP

(57) ABSTRACT

A memory circuit includes a memory array including a plurality of memory cells, wherein each of the plurality of memory cells is accessible through a plurality of bit lines, a comparator configured to receive a first address signal indicating a first row along which a first one of the memory cells is disposed and a second address signal indicating a second row along which a second one of the memory cells is disposed, and generate a control signal with a logic state indicating whether the first row is identical to the second row, a timing circuit configured to skip pre-charging the bit lines of the second memory cell after accessing the first memory cell, based on the logic state of the control signal.

20 Claims, 24 Drawing Sheets

(56) References Cited

FOREIGN PATENT DOCUMENTS

| | | | |
|---|---|---|---|
| TW | 201411642 | A | 3/2014 |
| TW | 201826286 | A | 7/2018 |
| TW | 202105395 | A | 2/2021 |
| TW | 202238581 | A | 10/2022 |

OTHER PUBLICATIONS

Office Action issued in Taiwan Appl. No. 113150758 dated Aug. 20, 2025.

Notice of Allowance issued in Korean Appl. No. 10-2025-0031907 dated Apr. 20, 2026.

* cited by examiner

| Row | Column |
|---|---|
| Same | Different |

| Row | Column |
|---|---|
| Same | Same |

1050

METHOD, DEVICE, AND CIRCUIT FOR MEMORIES FOR SKIPPING PRE-CHARGING

CROSS-REFERENCE TO RELATED APPLICATION

This application claims priority to and the benefit of U.S. Provisional Application No. 63/565,922, filed Mar. 15, 2024, entitled "New method of skipping BL pre-charge to reduce power in memory," which is incorporated herein by reference in its entirety for all purposes.

BACKGROUND

The semiconductor integrated circuit (IC) industry has experienced exponential growth. As ICs continue to scale down, more and more devices are integrated into the single chip. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
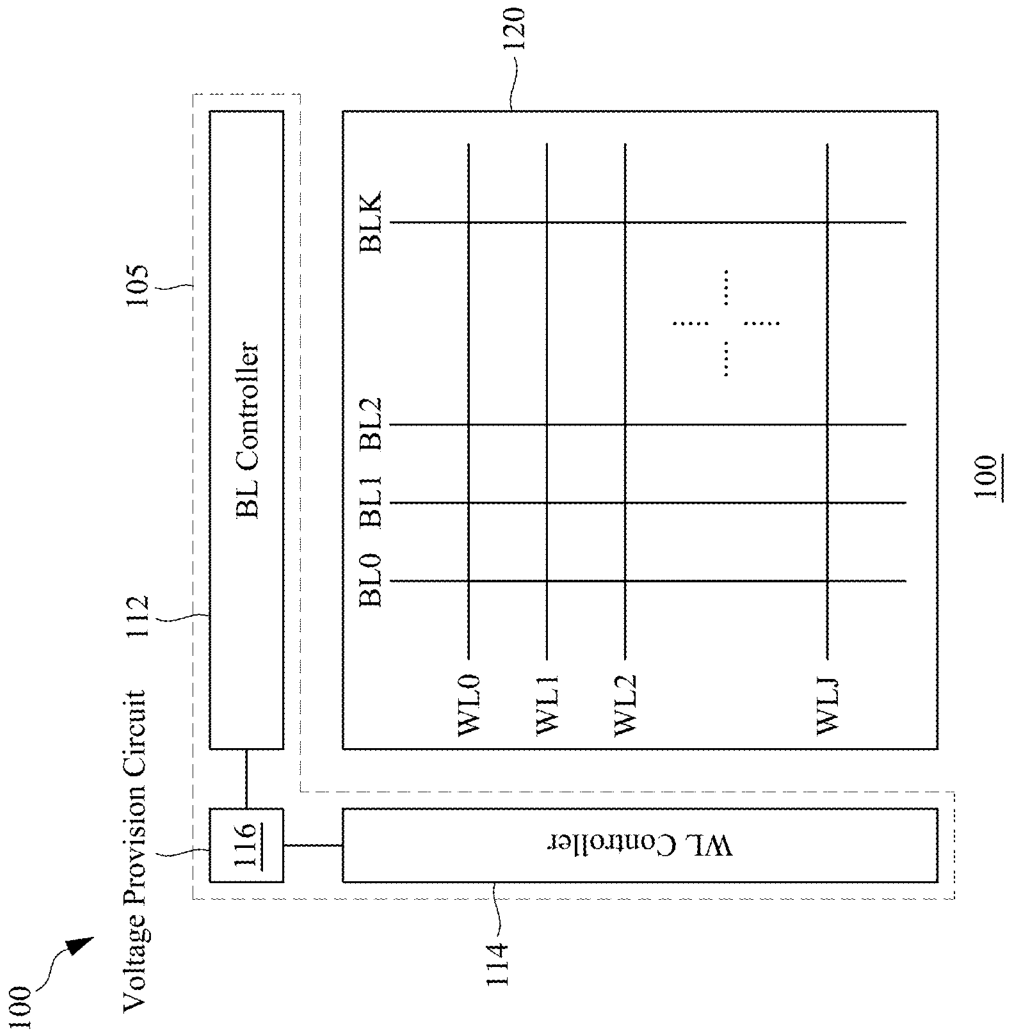
FIG. 1 shows a block diagram of an example circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a bit line pre-charging is commonly performed in a memory device, for example, prior to access (e.g., read, write) operation performed on the memory device. The percentage of power consumed by the bit line pre-charging can be significant. In accordance with the ever increasing trend of scaling down the dimensions and sizes of the memory device, this can disadvantageously impact overall performance of the memory device, and thus there is a need for reducing the power consumed by the bit line pre-charging. The present disclosure provides various embodiments of a memory circuit that can skip one or more pre-charging steps based on the locations of two subsequently accessed memory cells, thereby reducing the dynamic power. In some embodiments, the pre-charging can be skipped based on the locations (e.g., rows) of a first memory cell and a second memory cell accessed following the first memory cell. The memory circuit can be configured to compare a first address (e.g., the row) of the first memory cell and a second address (e.g., the row) of the second memory cell, and configured to skip the pre-charging according to a signal indicating that the first address and the second address indicate a same row. In some embodiments, the pre-charging can be skipped based on the operation (e.g., read or write) associated with the second memory cell. The memory circuit can be configured to decode an address signal, and configured to skip the pre-charging according to a signal indicating that a writing operation is performed for the address signal. This provides a simple and flexible solution to effectively reduce the power consumed by the pre-charging, while applicable for any memory macros that can use a bit line pre-charging.

FIG. 1 shows a block diagram of an example circuit 100, in accordance with some embodiments. The circuit 100 may be referred to as a memory device. The circuit 100 includes a memory array 120 and a memory controller 105. Shown in FIG. 1 is a non-limiting example of the circuit 100. In some embodiments, the circuit 100 can include more, fewer, or different components than shown in or described with respect to FIG. 1.

In some embodiments, the memory array 120 includes a plurality of storage circuits or memory cells. The memory array 120 further includes word lines WL0, WL1 . . . WLJ, each extending in a first direction (e.g., X-direction) and bit lines BL0, BL1 . . . BLK, each extending in a second direction (e.g., Y-direction). Each of the storage circuits or memory cells of the memory array 120 can be accessible through a plurality of bit lines BLs and/or a plurality of word lines WLs. The word lines WLs and the bit lines BLs may each be a conductive metal or conductive rail. In some embodiments, each memory cell is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells of a group of memory cells disposed along the second direction (e.g., Y-direction). The bit lines BL, BLB may receive and/or provide differential signals. In some embodiments, each of the memory cells in the memory array 120 can include a six-transistor (6T) static random access memory (SRAM) cell.

Each memory cell may include a volatile memory cell, a non-volatile memory cell, or a combination of them. For example, each memory cell is embodied as a static random access memory (SRAM) cell. However, it should be appreciated that the memory cell can be implemented as any of various other non-volatile memory cells such as, for example, a resistive random access memory (RRAM) cell, a magnetoresistive random access memory (MRAM) cell, a phase-change random access memory (PCRAM) cell, an eFuse, an anti-fuse, etc., while remaining within the scope of the present disclosure. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line (BL) controller 112, a word line (WL) controller 114, and a voltage provision circuit 110. The BL controller 112, the WL controller 114, and the voltage provision circuit 110 may be embodied as logic circuits, analog circuits, or a combination of them. In one configuration, the WL controller 114 is a circuit that provides a voltage or current through one or more word lines WLs of the memory array 120, and the BL controller 112 is a circuit that provides or senses a voltage or current through one or more bit lines BLs of the memory array 120. In one configuration, the voltage provision circuit 110 is a circuit that provides a voltage signal to the BL controller 112 and/or the WL controller 114. The BL controller 112 may be coupled to bit lines BLs of the memory array 120, and the WL controller 114 may be coupled to word lines WLs of the memory array 120. In some embodiments, the memory controller 105 includes more, fewer, or different components than shown in FIG. 1.

In some embodiments, the memory controller 105 can include and/or be operably coupled with a comparator. The comparator can be configured to receive an address signal indicating a row along which one of the memory cells is disposed. For example, the comparator can receive a first address signal indicating a first row along which a first one of the memory cells is disposed and a second address signal indicating a second row along which a second one of the memory cells is disposed. The comparator can generate a control signal with a logic state indicating whether the first row is identical to the second row. In some embodiments, the comparator can compare the first address signal with the second address signal so as to generate the control signal. The first address signal, in part, can indicate the first row of the first memory cell and the second address signal, in part, can indicate the second row of the second memory cell. The control signal can have a logic state indicating whether the first row is identical to the second row. In some embodiments, the comparator can be operably coupled with at least one of the BL controller 112, the WL controller 114, or the voltage provision circuit 116.

In some embodiments, the memory controller 105 can include and/or be operably coupled with a decoder. The decoder can be configured to receive an address signal. The address signal can, in part, indicate a column address of a memory cell. In some embodiments, the decoder can be configured to decode the address signal. Based on a decoding result, the decoder can be configured to generate a control signal. The control signal can include the decoding result. In some embodiments, the control signal can include a result of exponentiation. For example, when the address signal includes 3 bits (e.g., AYB<2:0>), the control signal can include the decoding result including the result of exponentiation (e.g., 23). The decoder can be configured to provide the control signal to the timing circuit. In some embodiments, the decoder can be operably coupled with at least one of the BL controller 112, the WL controller 114, or the voltage provision circuit 116.

In some embodiments, the memory controller 105 can include and/or be operably coupled with a timing circuit. The timing circuit can be configured to skip pre-charging the bit lines BLs of the second memory cell after accessing the first memory cell, based on the control signal (e.g., the logic state of the control signal). In some embodiments, the timing circuit can be operably coupled with at least one of the BL controller 112, the WL controller 114, or the voltage provision circuit 116.

Figure 2:
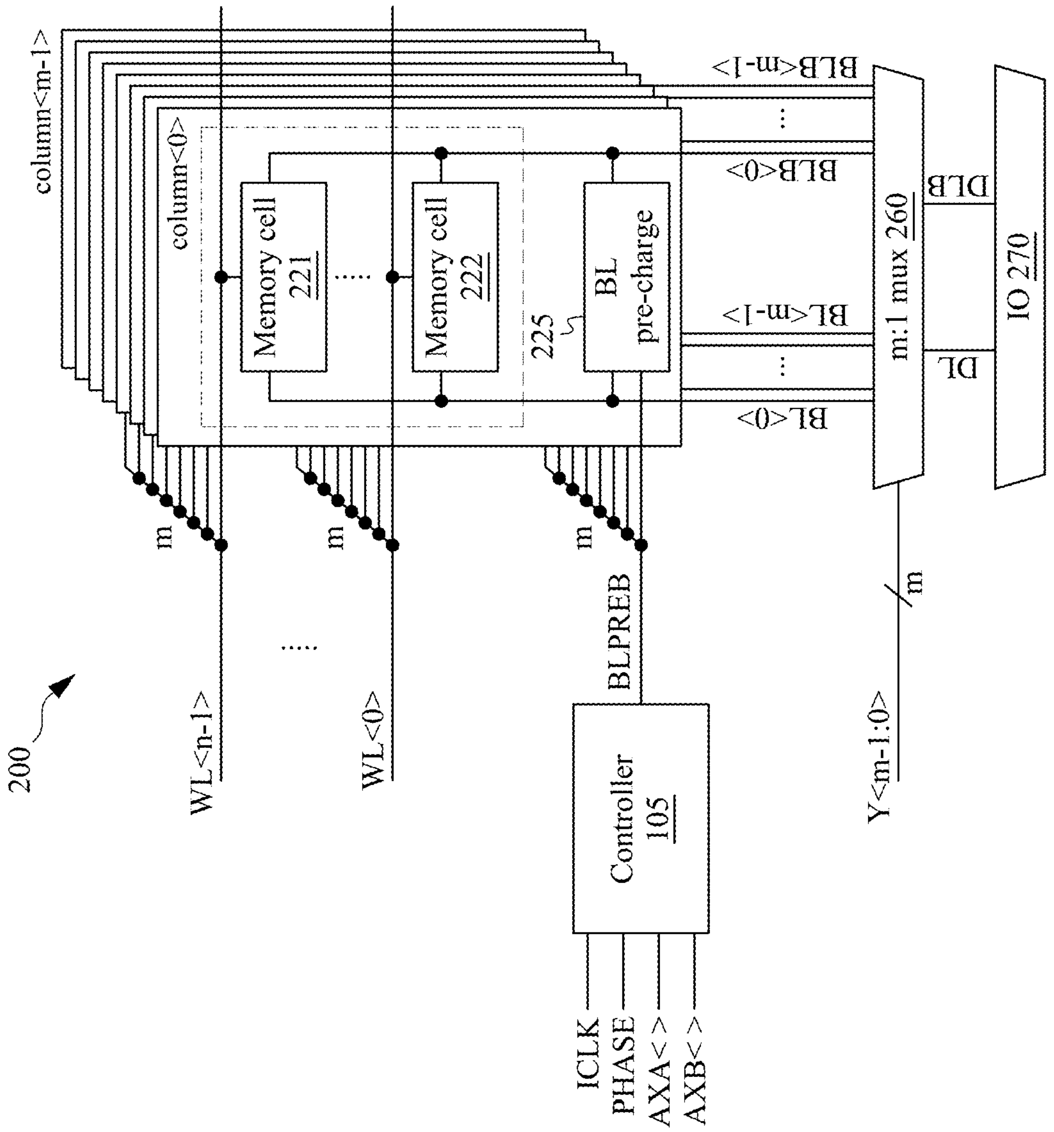
FIG. 2 shows a block diagram of an example circuit, in accordance with some embodiments.

FIG. 2 shows a block diagram of an example circuit, in accordance with some embodiments. More specifically, the circuit shown in FIG. 2 is the memory controller 105 operably coupled with an example memory circuit 220. The memory circuit 220 may be substantially similar to and/or incorporate features of the memory array 120. The memory circuit 220 can include a plurality of columns <0>, . . . , <m−1>, each of which includes a plurality of memory cells and a BL pre-charge circuit 225 and include a plurality of word lines WLs WL<0>, . . . , WL<n−1>. Shown in FIG. 2 is a non-limiting example of the circuit. In some embodiments, the circuit can include more, fewer, or different components than shown in or described with respect to FIG. 2. In some embodiments, the memory circuit 220 can include or be operably coupled with a multiplexer 260, an input-output (IO) interface 270, etc.

In some embodiments, the memory circuit 220 can include the BL pre-charge circuit 225. The BL pre-charge circuit 225 can be configured to control the memory cells of the memory circuit 220. In some embodiments, the BL pre-charge circuit 225 can be configured to charge the bit lines BLs, for example, during memory read or write operations. The BL pre-charge circuit 225 can receive a signal from the memory controller 105, and can control the memory cells of the memory circuit 220 based on the signal. In some embodiments, the BL pre-charge circuit 225 can include a transistor (e.g., a n-type transistor, a p-type transistor, a combination thereof, etc.).

The memory controller 105 can generate a pre-charge signal BLPREB to control the BL pre-charge circuit 225. In some embodiments, the memory controller 105 can receive a clock pulse ICLK, a phase signal PHASE, a first address signal AXA, a second address signal AXB, etc. Based on receipt of at least the first address signal AXA and the second address signal AXB, the memory controller 105 can generate the pre-charge signal BLPREB to control the BL pre-charge circuit 225, as discussed in detail below.

In some embodiments, the memory circuit 220 can be operably coupled with the IO interface 270. The IO interface 270 can include a circuit configured to read data from the memory circuit 220 through the bit lines BLs/BLBs and/or configured to write data onto the memory circuit 220 through the bit lines BLs/BLBs. In some embodiments, the IO interface 270 can be operably coupled with the memory circuit 220 through the multiplexer 260. The IO interface 270 can perform the read and/or write operations on a bit line BL/BLB selected from the multiplexer 260.

Figure 3:
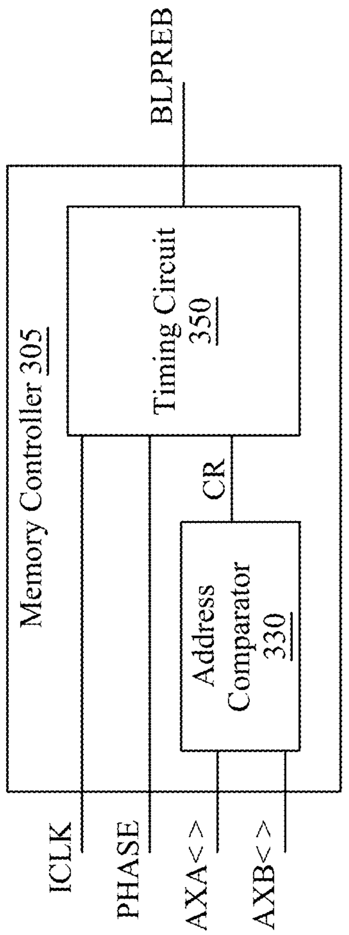
FIG. 3 shows a block diagram of an example circuit, in accordance with some embodiments.

FIG. 3 shows a block diagram of an example circuit, in accordance with some embodiments. More specifically, shown in FIG. 3 is an example memory controller 305. The memory controller 305 may be substantially similar to and/or incorporate features of the memory controller 105. The memory controller 305 can include an address comparator 330 and a timing circuit 350, which may be substantially similar to and/or incorporate features of the address comparator and the timing circuit, respectively, described with respect to FIG. 1. Shown in FIG. 3 is a non-limiting example of the memory controller 305. In some embodiments, the memory controller 305 can include more, fewer, or different components than shown in or described with respect to FIG. 3.

The address comparator 330 can be configured to receive a first address signal AXA. The first address signal AXA can, in part, indicate a first row of a first memory cell (e.g., the first memory cell 221). For example, the first address signal AXA can indicate the first row along which a first one of the memory cells is disposed. The address comparator 330 can receive a second address signal AXB. The second address signal AXB can, in part, indicate a second row of a second memory cell (e.g., the second memory cell 222). For example, the second address signal AXB can indicate the second row along which a second one of the memory cells is disposed.

In some embodiments, the address comparator 330 can be configured to compare the first address signal AXA with the second address signal AXB. Based on a comparison between the first address signal AXA with the second address signal AXB, the address comparator 330 can be configured to generate a control signal CR. The control signal CR can include a comparison result. In some embodiments, the control signal CR can indicate whether the first row is identical to the second row. In some embodiments, the control signal CR can have a logic state indicating whether the first row is identical to the second row. For example, the control signal CR with a logic state (e.g., “1”) may indicate that the first row is identical to the second row, while the control signal CR with a logic state (e.g., “0”) may indicate that the first row is not identical to the second row.

The timing circuit 350 can be configured to receive a clock pulse ICLK, a phase signal PHASE, and the control signal CR. Based on receipt of at least the control signal CR, the timing circuit 350 can provide a pre-charge signal BLPREB. The pre-charge signal BLPREB can be configured to skip pre-charging the bit lines BLs of the second memory cell (e.g., the second memory cell 222) after accessing the first memory cell (e.g., the first memory cell 221), based on the logic state of the control signal CR. In some embodiments, the phase signal PHASE can be a signal configured to transition between different logic states (e.g., “0” and “1”) when accessing respective memory cells of the memory array.

In some embodiments, the timing circuit 350 can be operably coupled with an external circuit or pin. The timing circuit 350 can receive, from the external circuit or pin, a signal indicating whether the first row is identical to the second row.

Figure 4:
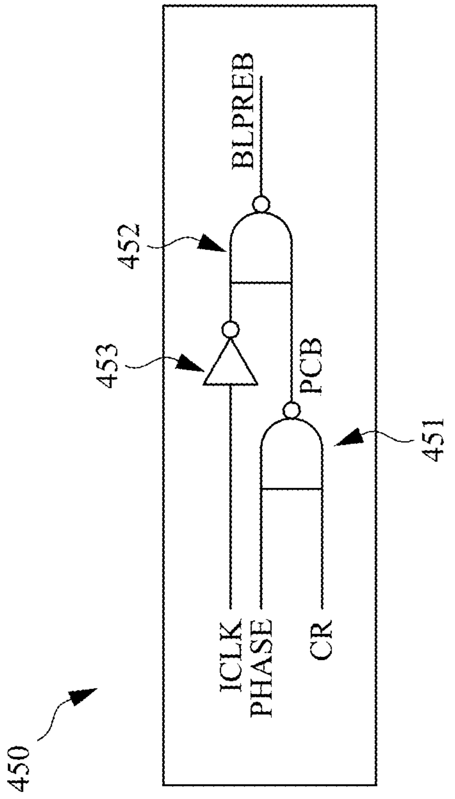
FIG. 4 shows a block diagram of an example circuit, in accordance with some embodiments.

FIG. 4 shows a block diagram of an example circuit, in accordance with some embodiments. More specifically, shown in FIG. 4 is an example timing circuit 450. The timing circuit 450 may be substantially similar to and/or incorporate features of the timing circuit 350. Shown in FIG. 4 is a non-limiting example of the timing circuit 450. In some embodiments, the timing circuit 450 can include more, fewer, or different components than shown in or described with respect to FIG. 4.

In some embodiments, the timing circuit 450 can include at least one logic gate. In some embodiments, the timing circuit 450 can include a first NAND gate 451 and a second NAND gate 452. The first NAND gate 451 can be configured to receive the control signal CR and the phase signal PHASE. Based on the control signal CR and the phase signal PHASE, the first NAND gate 451 can provide an output PCB. The second NAND gate 452 can be configured to receive the output PCB and a logically inverted clock pulse (e.g., the clock pulse ICLK through an inverter 453). Based on the output PCB and the logically inverted clock pulse, the second NAND gate 452 can provide a pre-charge signal BLPREB.

In some embodiments, the timing circuit 450 can be configured to control the pre-charging of the bit lines BLs of the memory array. In some embodiments, the pre-charge signal BLPREB can be configured for pre-charging of the bit lines BLs of the memory array (e.g., the memory array 120). For example, the pre-charge signal BLPREB can cause a BL pre-charge circuit (e.g., the BL pre-charge circuit 225) to pre-charge the bit lines BLs of the memory array. In some embodiments, the pre-charge signal BLPREB can be configured for pre-charging operations. For example, the pre-charge signal BLPREB can cause the BL pre-charge circuit (e.g., the BL pre-charge circuit 225) to skip the pre-charging of the bit lines BLs of the memory array. In some embodiments, the timing circuit 450 can be configured to skip pre-charging of the bit lines BLs based on an access timing. For example, the timing circuit 450 can be configured to skip pre-charging of the bit lines BLs of a second memory cell (e.g., the second memory cell 222) after accessing a first memory cell (e.g., the first memory cell 221), based on the logic state of the control signal CR.

For example, when the control signal CR has a logic state of (e.g., "0") (e.g., the first row is not identical to the second row), and the output PCB has a logic state of "1," which synchronizes with the clock pulse ICLK, the pre-charge signal BLPREB can cause the BL pre-charge circuit (e.g., the BL pre-charge circuit 225) to pre-charge the bit lines BLs of the memory array. When the control signal CR has a logic state of (e.g., "1") (e.g., the first row is identical to the second row), and the output PCB has a logic state of "0," the logic state of the pre-charge signal BLPREB is "1," thereby causing the BL pre-charge circuit (e.g., the BL pre-charge circuit 225) to skip the pre-charging of the bit lines BLs of the memory array. In some embodiments, a transistor of the BL pre-charge circuit (e.g., the BL pre-charge circuit 225) can be turned off to stop the pre-charging of the bit lines BLs.

Figure 5:
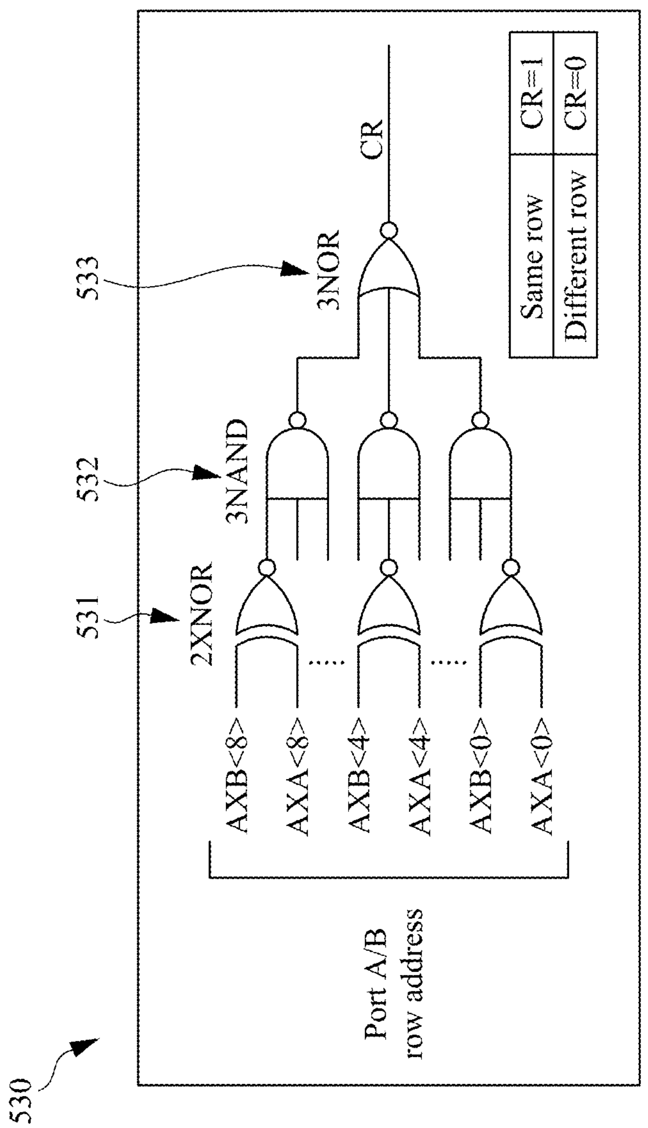
FIG. 5 shows a block diagram of an example circuit, in accordance with some embodiments.

FIG. 5 shows a block diagram of an example circuit, in accordance with some embodiments. More specifically, shown in FIG. 5 is an example address comparator 530. The address comparator 530 may be substantially similar to and/or incorporate features of the address comparator 330. Shown in FIG. 5 is a non-limiting example of the address comparator 530. In some embodiments, the address comparator 530 can include more, fewer, or different components than shown in or described with respect to FIG. 5.

In some embodiments, the address comparator 530 can include at least one logic gate. In some embodiments, the address comparator 530 can include a plurality of first XNOR gates 531, a plurality of NAND gates 532, and an NOR gate 533. Each of the first XNOR gates 531 can include two inputs. A first input can receive a first address signal AXA (e.g., AXA<0>, . . . , AXA<y−1>) indicating a first row along which a first one of the memory cells (e.g., of the memory array 120) is disposed. A second input can receive a second address signal AXB (e.g., AXB<0>, . . . , AXB<y−1>) indicating a second row along which a second one of the memory cells (e.g., of the memory array 120) is disposed. Here, y=9 is shown as a non-limiting example of the address comparator 530 for 9 bits and n=512. The first XNOR gates 531 can provide an output of the XNOR operation to a corresponding one of the plurality of NAND gates 532.

The address comparator 530 can include k numbers (k=3 is shown in FIG. 5 as an example) of the NAND gates 532. In some embodiments, each of the NAND gates 532 can include l inputs (l=3 is shown in FIG. 5 as an example). In some embodiments, the number k of the NAND gates 532 may be the number of XNOR gates 531 divided by l, such that each of the NAND gates 532 can be configured to receive the output (e.g., an XNOR operation of the first address signal AXA and the second address signal AXB) from at least one of the XNOR gates 531. The NAND gates 532 can provide an output of the NAND operation to the NOR gate 533.

In some embodiments, the NOR gate 533 can include h inputs (h=3 is shown in FIG. 5 as an example). Each input of the NOR gate 533 can receive the output (e.g., a NAND operation) from the NAND gates 532. The NOR gate 533 can provide an output of the NOR operation. As discussed herein, based at least one logic operation, the address comparator 530 can provide the control signal CR.

In some embodiments, the control signal CR can include and/or indicate a logic state. For example, when the first row (e.g., indicated by the first address signal AXA) along which the first one of the memory cells is disposed, is identical to the second row (e.g., indicated by the second address signal AXB) along which the second one of the memory cells is disposed, the logic state of the control signal CR can be "1," while when the first row is not identical to the second row, the logic state of the control signal CR can be "0," or vice versa.

Figure 6:
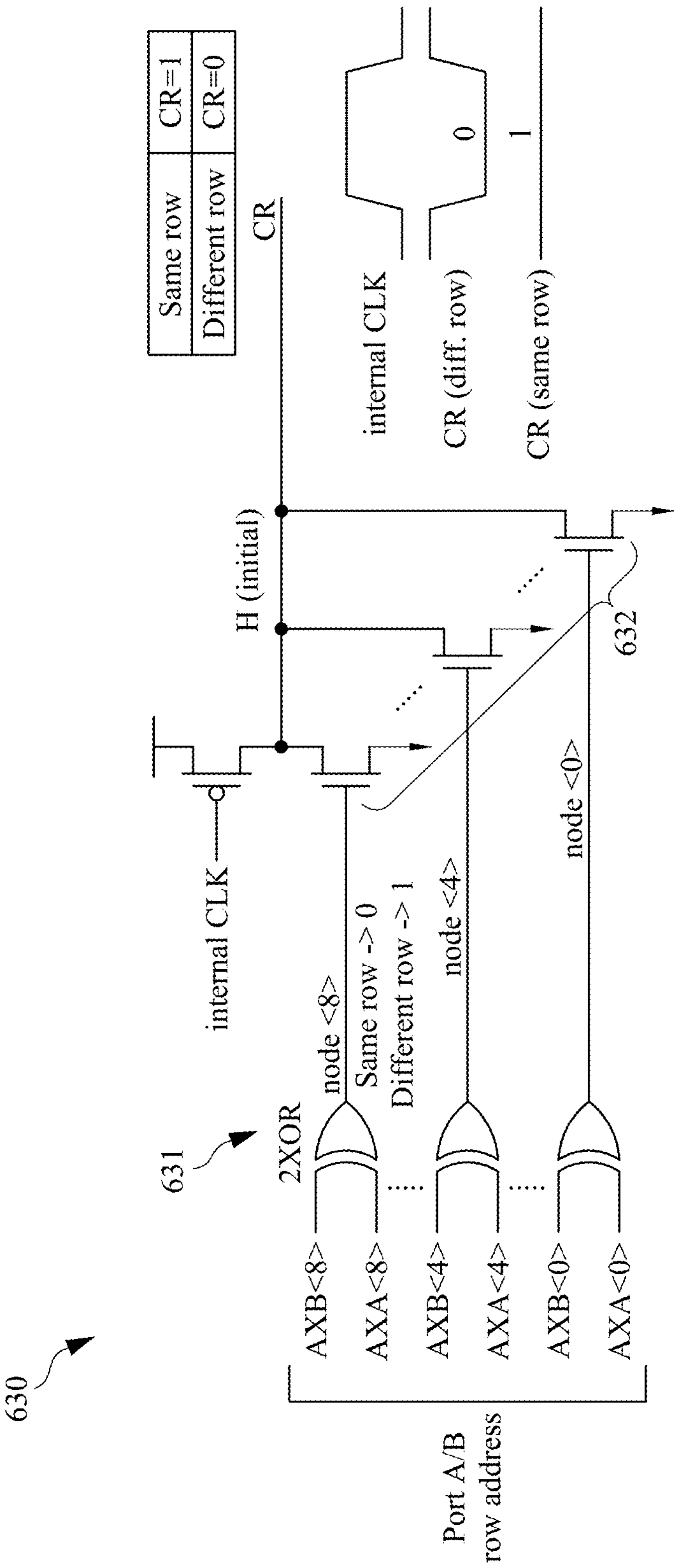
FIG. 6 shows a block diagram of an example circuit, in accordance with some embodiments.

FIG. 6 shows a block diagram of an example circuit, in accordance with some embodiments. More specifically, shown in FIG. 6 is an example address comparator 630. The address comparator 630 may be substantially similar to and/or incorporate features of the address comparator 330. Shown in FIG. 6 is a non-limiting example of the address comparator 630. In some embodiments, the address comparator 630 can include more, fewer, or different components than shown in or described with respect to FIG. 6.

In some embodiments, the address comparator 630 can include at least one logic gate. In some embodiments, the address comparator 630 can include a plurality of first XOR gates 631 and a plurality of n-type transistors 632. Each of the first XOR gates 631 can include two inputs. A first input can receive a first address signal AXA (e.g., AXA<0>, . . . , AXA<y−1>) indicating a first row along which a first one of the memory cells (e.g., of the memory array 120) is disposed. A second input can receive a second address signal AXB (e.g., AXB<0>, . . . , AXB<y−1>) indicating a second row along which a second one of the memory cells (e.g., of the memory array 120) is disposed. Each of the first XOR gates 631 can provide an output of the XOR operation to a corresponding one of the plurality of n-type transistors 632.

For example, when the first row (e.g., indicated by the first address signal AXA) along which the first one of the memory cells is disposed, is identical to the second row (e.g., indicated by the second address signal AXB) along which the second one of the memory cells is disposed, the corresponding one of the first XOR gates 631 can provide an output having a logic state of "1." The corresponding one of the n-type transistors 632 can receive the output from the corresponding one of the first XOR gates 631 and can be on. When the first row is not identical to the second row, the corresponding one of the first XOR gates 631 can provide an output having a logic state of "0." The corresponding one of the n-type transistors 632 can receive the output from the corresponding one of the first XOR gates 631 and can be off.

In some embodiments, the address comparator 630 can include an inverter (not shown) configured to invert a logic state of the output of the n-type transistors 632. For example, when the corresponding one of the n-type transistors 632 is on (e.g., responsive to the output from the corresponding one of the XOR gates 631), the address comparator 630 can provide the control signal CR having a logic state of "0." When the corresponding one of the n-type transistors 632 is off (e.g., responsive to the output from the corresponding one of the XOR gates 631), the address comparator 630 can provide the control signal CR having a logic state of "1."

In some embodiments, the address comparator 630 can receive an internal clock signal. In some embodiments, the address comparator 630 can include a p-type transistor, through which an internal clock signal can be provided. In some embodiments, the address comparator 630 can provide the control signal CR based on the internal clock signal. In some embodiments, the address comparator 630 can provide the control signal CR selectively from one of the XOR gates 631 based on the internal clock signal.

Figure 7:
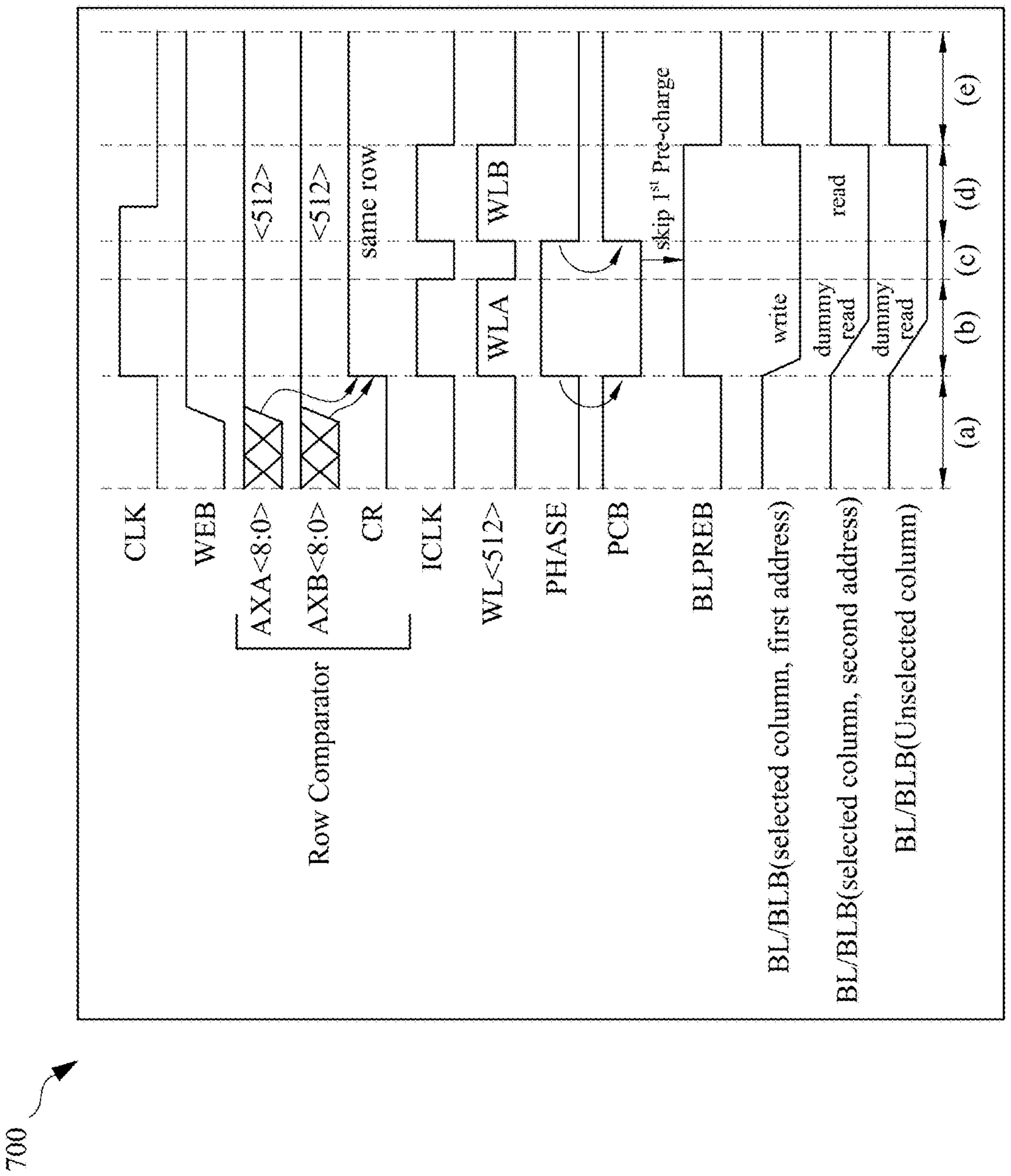
FIG. 7 shows example waveforms associated with a circuit, in accordance with some embodiments.

FIG. 7 shows example waveforms 700 associated with a circuit, in accordance with some embodiments. In some embodiments, the waveforms 700 may be associated with operation of the memory controller 305. Shown in FIG. 7 is a non-limiting examples of the waveforms 700.

The circuit (e.g., the memory controller 305) can operate based on an external clock signal CLK. An address comparator (e.g., the address comparator 330) can receive a first address signal AXA and a second address signal AXB. The address comparator can provide a control signal CR based on a comparison between the first address signal AXA<8:0> and the second address signal AXB<8:0>. A timing circuit (e.g., the timing circuit 350) can receive a logically inverted clock pulse ICLK and a phase signal PHASE. The timing circuit can provide an output PCB based on a logic operation of the phase signal PHASE and the control signal CR. The timing circuit can provide a pre-charge signal BLPREB based on a logic operation of the output PCB and the logically inverted clock pulse ICLK. The waveforms 700 include a word line signal WL and a bit line signal BL/BLB (e.g., the first memory cell and the second memory cell in the selected column, and the unselected column).

In period (a), each of the first address signal AXA (e.g., AXA<8:0>) and the second address signal AXB (e.g., AXB<8:0>) can have 9 bits and select the 512th row with a logic state of "1." (e.g., shown in FIG. 7 is an example of n=512).

In period (b), when the external clock signal CLK is asserted, the clock pulse ICLK can be generated. Then, the word line signal WL can be asserted in sync with the clock pulse ICLK according to the first address signal AXA. The address comparator can compare the first address signal AXA and the second address signal AXB, and then provide the control signal CR of a logic state of "1," since the first row indicated by the first address signal AXA is identical to the second row indicated by the second address signal AXB. Based on the control signal CR, the phase signal PHASE, and the clock pulse ICLK, the timing circuit can provide the pre-charge signal BLPREB with a logic state of "1," thereby skipping the BL pre-charge and allowing for the selected column to be accessed for a write/read operation. For the unselected columns, only the word line WL is selected, causing a BL voltage to drop through a dummy read operation.

In period (c), the clock pulse ICLK is negated. Operation corresponding to the first address signal AXA can end, and the word line WL corresponding to the first address signal AXA can close. Since the output PCB has a logic state of "0," the pre-charge signal BLPREB has a logic state of "1," the control signal has a logic state of "1," and the phase signal PHASE has a logic state of "1," the pre-charging of the bit line BL can be skipped in period (c). Since the pre-charging is skipped, the period (c) can be reduced and/or shortened.

In period (d), when the clock pulse ICLK is asserted, operation for the second address signal AXB can begin. The word line signal WL can be asserted in sync with the clock pulse ICLK according to the second address signal AXB. Since the phase signal PHASE can transition between different logic states when accessing respective memory cells of the memory array, the phase signal PHASE has a logic state (e.g., "0") in period (d). The pre-charge signal BLPREB can synchronize with the clock pulse ICLK. Since the clock pulse ICLK has a logic state of "1," the pre-charge signal BLPREB can have a logic state of "1," thereby skipping the pre-charging. In some embodiments, a voltage of the bit line BL/BLB can remain the same as the voltage at the end of the period (b). That is, for the selected column associated with the first address signal AXA, the written data can remain, and for the unselected column, the dummy read data can remain.

In some embodiments, when a read operation is selected with respect to the second address signal AXB, an IO interface (e.g., the IO interface 270) can determine the data based on a voltage associated with the second address signal AXB for the selected column. Although a dummy read operation is performed with the second address signal AXB for the unselected column, since the operation is performed in the same row as the operation performed with respect to the first address signal AXA, the data from the same cells can be also dummy read, and thus the logical data can remain the same.

In some embodiments, the first memory cell is first accessed based on asserting a first clock pulse (e.g., the clock pulse ICLK at (b)), and the second memory cell is then accessed based on asserting a second clock pulse (e.g., the clock pulse ICLK at (d)). In some embodiments, the first clock pulse and the second clock pulse can be within one clock cycle (e.g., the clock signal CLK).

When the clock pulse ICLK is negated in period (e), operation corresponding to the second address signal AXB can end, and the word line WL corresponding to the second address signal AXB can close. The pre-charge signal BLPREB can synchronize with the clock pulse ICLK, and can have a logic state of "0," thereby performing a pre-charging (e.g., for a next cycle). In some embodiments, when the selected row corresponding to the first address signal AXA in the next cycle remains the same, the pre-charging can be skipped.

Although described with respect to two address signals (e.g., the first address signal AXA and the second address signal AXB), the circuit disclosed herein and operation thereof are not limited to a number of the address signals. For example, the circuit disclosed herein can operate based on any number of multiple address signals.

Figure 10A:
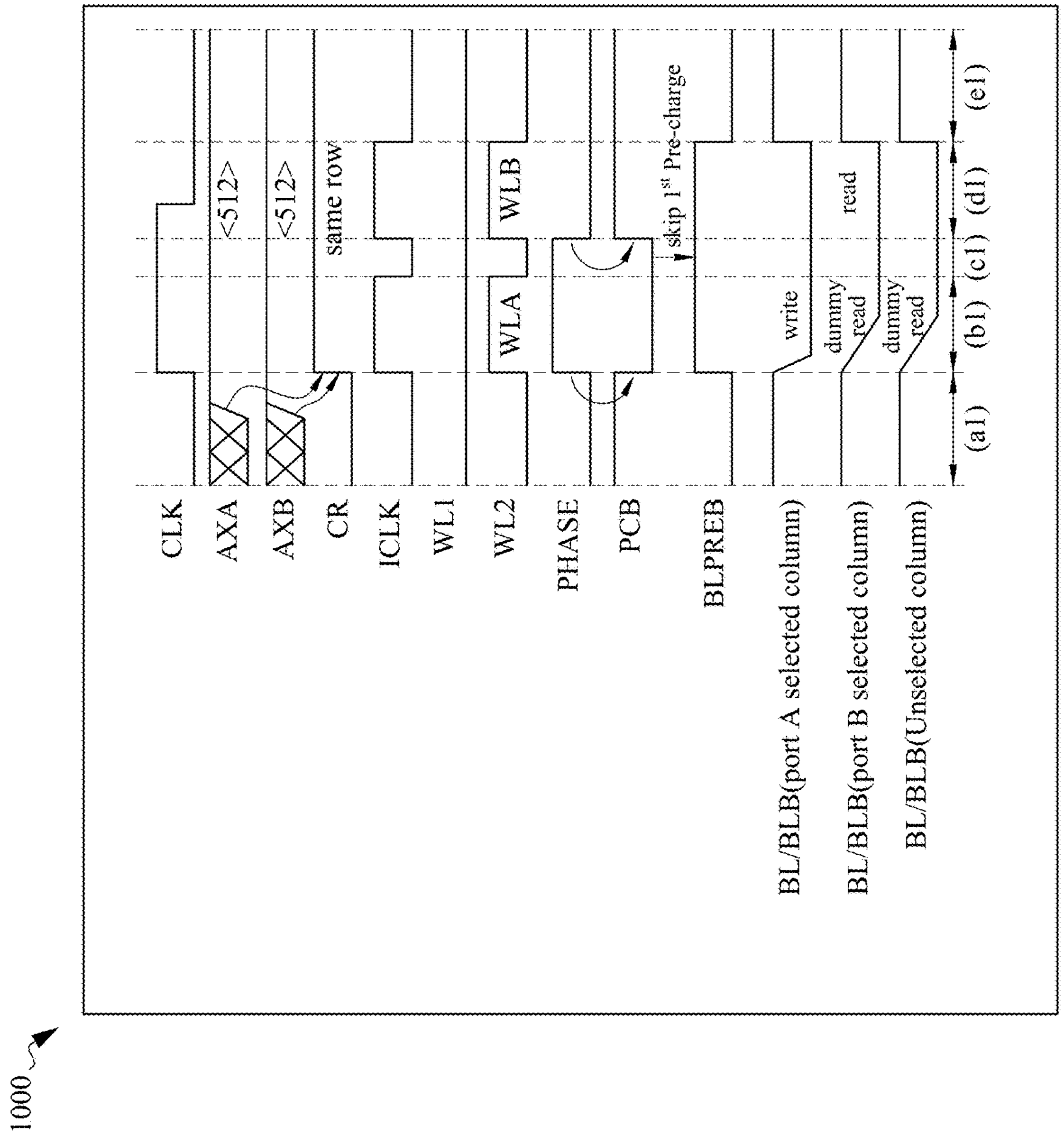
FIG. 10A shows example waveforms associated with a circuit, in accordance with some embodiments.
Figure 10B:
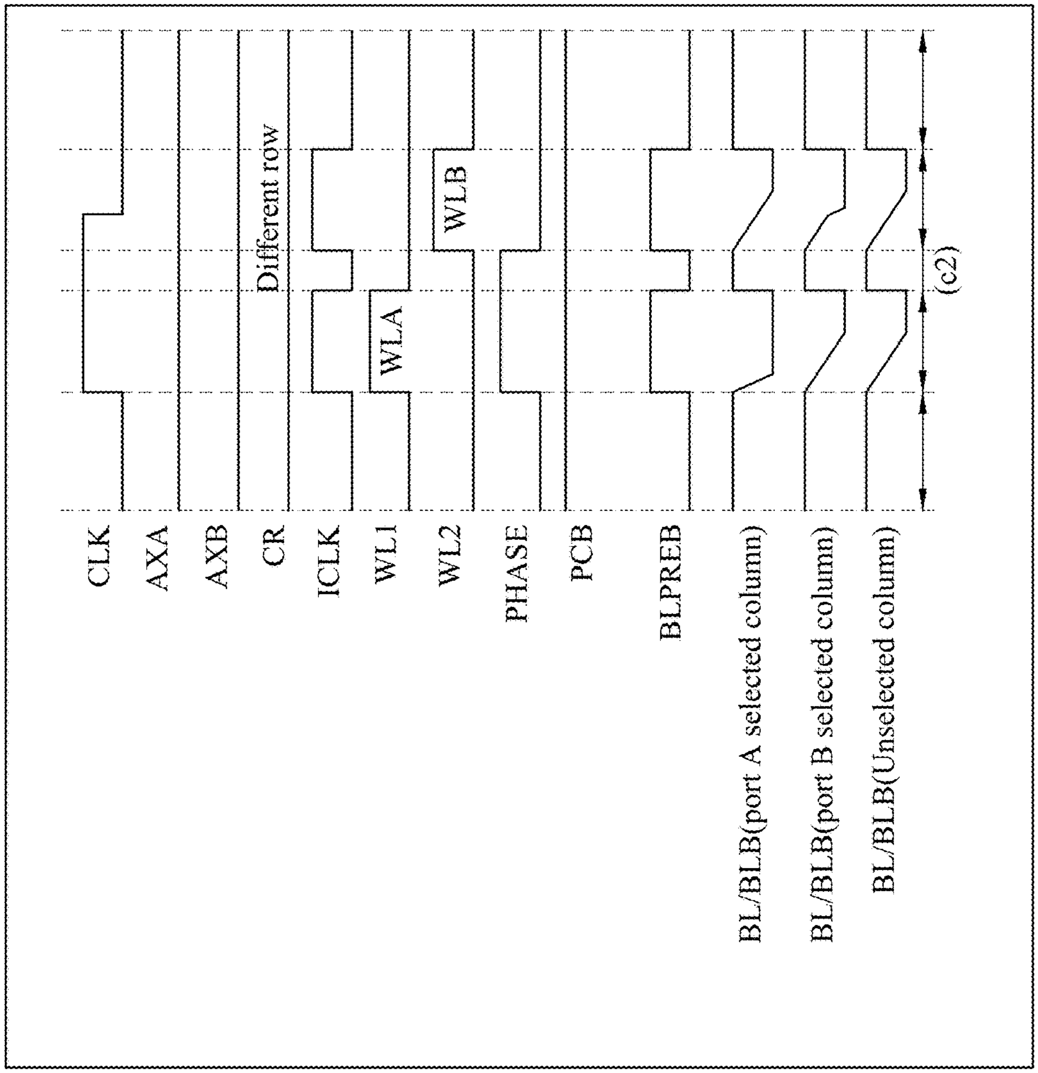
FIG. 10B shows example waveforms associated with a circuit, in accordance with some embodiments.

In some embodiments, the waveforms 1050 of FIG. 10B may be for a first cycle of the clock signal CLK, and the waveforms 1000 of FIG. 10A may be for a second cycle following the first cycle. In some embodiments, during the first cycle of the clock signal CLK in which the first and second memory cells are sequentially accessed, the timing circuit can be configured to, before accessing the first memory cell, generate the pre-charge signal BLPREB with a first logic state (e.g., "0") to pre-charge bit lines BLs of the first memory cell before accessing the first memory cell. The timing circuit can be configured to, after accessing the first memory cell, generate the pre-charge signal BLPREB with a second logic state (e.g., "1") to skip pre-charging the bit lines BLs of the second memory cell, responsive to receiving the logic state of the control signal CR indicating that the first row is identical to the second row.

In some embodiments, the first memory cell can be accessed based on a first pulse of the clock pulse ICLK within the first cycle of the clock signal CLK, and the second memory cell can be accessed based on a second pulse of the clock pulse ICLK within the first cycle of the clock signal CLK. In some embodiments, during the first cycle of the clock signal CLK, the timing circuit can be configured to, after accessing the second memory cell, generate the pre-charge signal BLPREB with the second logic state (e.g., "1") to again skip pre-charging bit lines BLs of a third memory cell that is configured to be accessed during a second, subsequent cycle of the clock signal CLK, responsive to receiving the logic state (e.g., "1") of the control signal CR indicating that the second row is identical to a third row of the third memory cell.

Figure 8A:
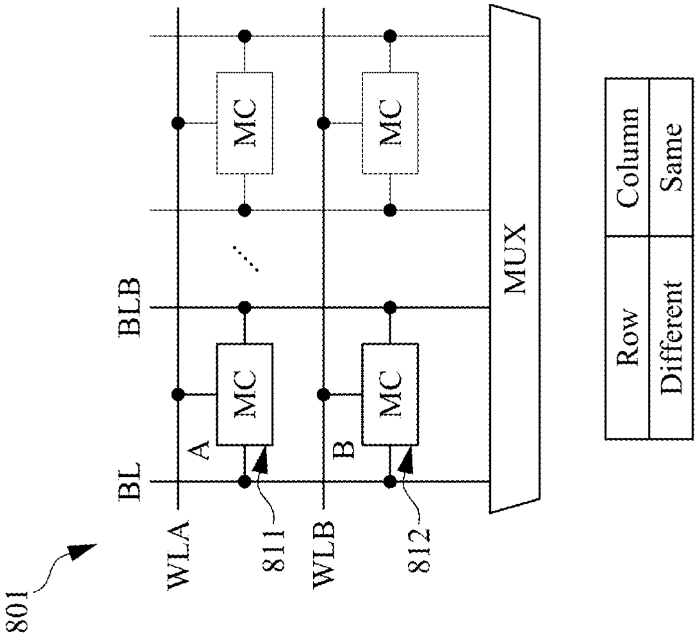
FIG. 8A shows a block diagram of an example circuit, in accordance with some embodiments.

FIG. 8A shows a block diagram of an example circuit 801, in accordance with some embodiments. More specifically, the circuit 801 is an example memory array including a plurality of memory cells (MCs), in which a first row of a first memory cell 811 indicated by a first address signal AXA is not identical to a second row of a second memory cell 812 indicated by a second address signal AXB while the first memory cell 811 and the second memory cell 812 are in a same column.

The word line WLA of the first memory cell 811 is turned on, and the data of the first memory cell 811 connected to the word line WLA is connected to the bit lines BL/BLB. The data connected to the word line WLA can be on the bit line BL/BLB. Based on the second address signal AXB, the word line WLB is turned on, and the data of the second memory cell 812 connected to the word line WLB is connected to the bit line BL/BLB. Since the word line WLA, which is turned on by the first address signal AXA, the accessed memory cell is different. Thus, the second memory cell 812, connected to the second address signal AXB with opposite data to the first address signal AXA is accessed. In this case, if the pre-charging is not performed, opening the word line WLB with the opposite data on the bit line BL/BLB may result in writing reversed data to the second memory cell 812, resulting in malfunction of the circuit 801. Thus, the pre-charging can be performed without skipping when the first row of the first memory cell 811 indicated by the first address signal AXA is not identical to the second row of the second memory cell 812 indicated by the second address signal AXB.

Figure 8B:
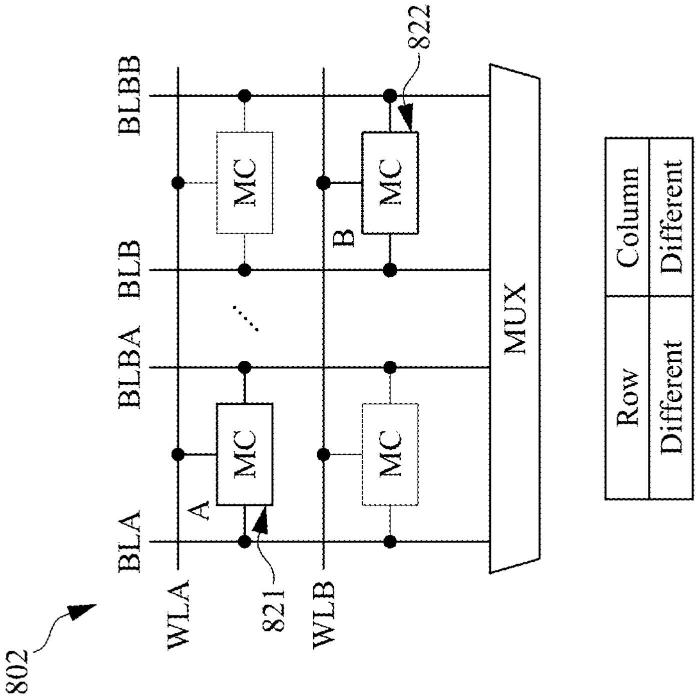
FIG. 8B shows a block diagram of an example circuit, in accordance with some embodiments.

FIG. 8B shows a block diagram of an example circuit 802, in accordance with some embodiments. More specifically, the circuit 802 is an example memory array including a plurality of memory cells (MCs), in which a first row of a first memory cell 821 indicated by a first address signal AXA is not identical to a second row of a second memory cell 822 indicated by a second address signal AXB while the first memory cell 821 and the second memory cell 822 are in different columns.

The word line WLA of the first memory cell 821 is turned on, and the data of the first memory cell 821 connected to the word line WLA is connected to the bit lines BLA/BLBA. The data connected to the word line WLA can be on the bit line BLA/BLBA. Based on the second address signal AXB, the word line WLB is turned on, and the data of the second memory cell 822 connected to the word line WLB is connected to the bit line BLB/BLBB. Since the word line WLA, which is turned on by the first address signal AXA, the accessed memory cell is different. Thus, the second memory cell 822, connected to the second address signal AXB with opposite data to the first address signal AXA is accessed. In this case, if the pre-charging is not performed, opening the word line WLB with the opposite data on the bit line BLB/BLBB may result in writing reversed data to the second memory cell 822, resulting in malfunction of the circuit 802. Thus, the pre-charging can be performed without skipping when the first row of the first memory cell 821 indicated by the first address signal AXA is not identical to the second row of the second memory cell 822 indicated by the second address signal AXB.

Figure 9A:
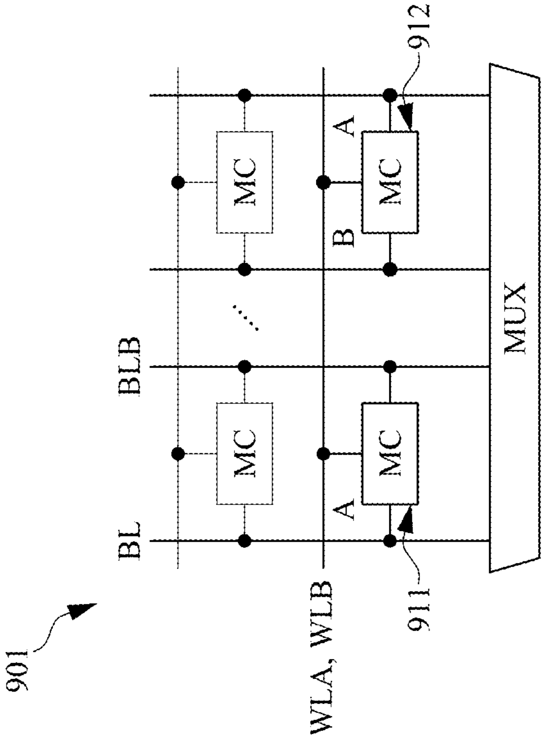
FIG. 9A shows a block diagram of an example circuit, in accordance with some embodiments.

FIG. 9A shows a block diagram of an example circuit 901, in accordance with some embodiments. More specifically, the circuit 901 is an example memory array including a plurality of memory cells (MCs), in which a first row of a first memory cell 911 indicated by a first address signal AXA is identical to a second row of a second memory cell 912 indicated by a second address signal AXB while the first memory cell 911 and the second memory cell 912 are in different columns.

The word line WLA of the first memory cell 911 is turned on, and the data of the first memory cell 911 connected to the word line WLA is connected to the bit lines BLA/BLBA. The data connected to the word line WLA can be on the bit line BLA/BLBA. Based on the second address signal AXB, the word line WLB (which is the same as the word line WLA) is turned on, and the data of the second memory cell 912 connected to the word line WLB is connected to the bit line BLB/BLBB. Since the first memory cell 911 and the second memory cell 912 are in the same row, and the word line WLA and the word line WLB are the same, the data on the BL/BLB for the first address signal AXA and the data on the BL/BLB for the second address signal AXB can be the same, which can prevent malfunction due to erroneous data writing and thereby allowing for skipping of the pre-charging.

Figure 9B:
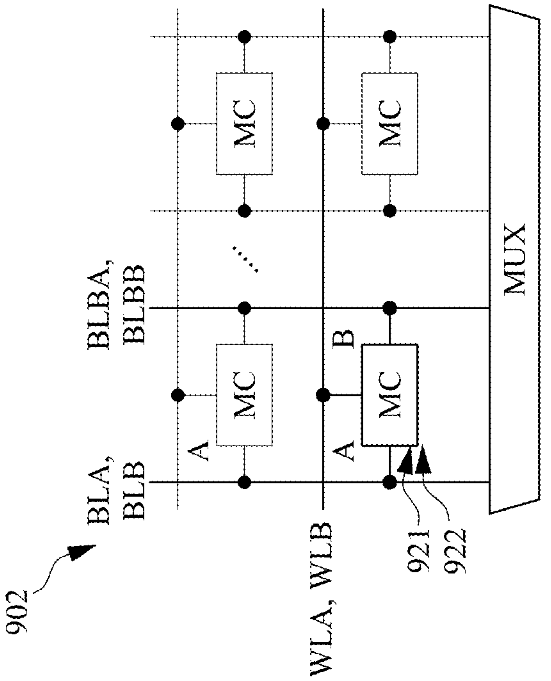
FIG. 9B shows a block diagram of an example circuit, in accordance with some embodiments.

FIG. 9B shows a block diagram of an example circuit 902, in accordance with some embodiments. More specifically, the circuit 902 is an example memory array including a plurality of memory cells (MCs), in which a first row of a first memory cell 921 indicated by a first address signal AXA is identical to a second row of a second memory cell 922 indicated by a second address signal AXB while the first memory cell 921 and the second memory cell 922 are in a same column. Here, the first memory cell 921 and the second memory cell 922 are the same, but referred to as separately with the different numerals to clarify that the first memory cell 921 is indicated by the first address signal AXA and the second memory cell 922 is indicated by the second address signal AXB.

The word line WLA of the first memory cell 921 is turned on, and the data of the first memory cell 921 connected to the word line WLA is connected to the bit lines BLA/BLBA. The data connected to the word line WLA can be on the bit line BLA/BLBA. Based on the second address signal AXB, the word line WLB (which is the same as the word line WLA) is turned on, and the data of the second memory cell 922 connected to the word line WLB is connected to the bit line BLB/BLBB (which is the same as the bit line BLA/BLBA). Since the first memory cell 921 and the second memory cell 922 are in the same row, and the word line WLA and the word line WLB are the same, the data on the BLA/BLBA for the first address signal AXA and the data on the BLB/BLBB for the second address signal AXB can be the same, which can prevent malfunction due to erroneous data writing and thereby allowing for skipping of the pre-charging.

FIG. 10A shows example waveforms 1000 associated with a circuit, in accordance with some embodiments. In some embodiments, the waveforms 1000 may be associated with operation of the memory controller 305, the circuit 901, the circuit 902, etc. Shown in FIG. 10A is a non-limiting examples of the waveforms 1000. In some embodiments, the waveforms 1000 may be substantially similar to or incorporate features of the waveforms 700.

In some embodiments, the circuit (e.g., the memory controller 305) can operate based on an external clock signal CLK. An address comparator (e.g., the address comparator 330) can receive a first address signal AXA and a second address signal AXB. The address comparator can provide a control signal CR based on a comparison between the first address signal AXA<8:0> and the second address signal AXB<8:0>. A timing circuit (e.g., the timing circuit 350) can receive a logically inverted clock pulse ICLK and a phase signal PHASE. The timing circuit can provide an output PCB based on a logic operation of the phase signal PHASE and the control signal CR. The timing circuit can provide a pre-charge signal BLPREB based on a logic operation of the output PCB and the logically inverted clock pulse ICLK. The waveforms 1000 include a word line signal WL and a bit line signal BL/BLB (e.g., the first memory cell and the second memory cell in the selected column, and the unselected column).

In some embodiments, when a row of a first memory cell (e.g., the first memory cell 911, the first memory cell 921, etc.) indicated by the first address signal AXA is identical to a row of a second memory cell (e.g., the second memory cell 912, the second memory cell 922, etc.) indicated by the second address signal AXB, the pre-charging can be skipped in period (c1). Since the pre-charging can be skipped, the period (c1) can be reduced and/or shortened.

FIG. 10B shows example waveforms 1050 associated with a circuit, in accordance with some embodiments. In some embodiments, the waveforms 1050 may be associated with operation of the memory controller 305, the circuit 801, the circuit 802, etc. Shown in FIG. 10B is a non-limiting examples of the waveforms 1050.

The circuit (e.g., the memory controller 305) can operate based on an external clock signal CLK. An address comparator (e.g., the address comparator 330) can receive a first address signal AXA and a second address signal AXB. The address comparator can provide a control signal CR based on a comparison between the first address signal AXA<8:0> and the second address signal AXB<8:0>. A timing circuit (e.g., the timing circuit 350) can receive a logically inverted clock pulse ICLK and a phase signal PHASE. The timing circuit can provide an output PCB based on a logic operation of the phase signal PHASE and the control signal CR. The timing circuit can provide a pre-charge signal BLPREB based on a logic operation of the output PCB and the logically inverted clock pulse ICLK. The waveforms 1050 include a word line signal WL and a bit line signal BL/BLB (e.g., the first memory cell and the second memory cell in the selected column, and the unselected column).

In some embodiments, when a row of a first memory cell (e.g., the first memory cell 811, the first memory cell 821, etc.) indicated by the first address signal AXA is not identical to a row of a second memory cell (e.g., the second memory cell 812, the second memory cell 822, etc.) indicated by the second address signal AXB, the pre-charging can be performed in period (c2). Since the pre-charging is performed, in some embodiments, the period (c1) of FIG. 10A can be shorter than the period (c2) of FIG. 10B.

Figure 11B:
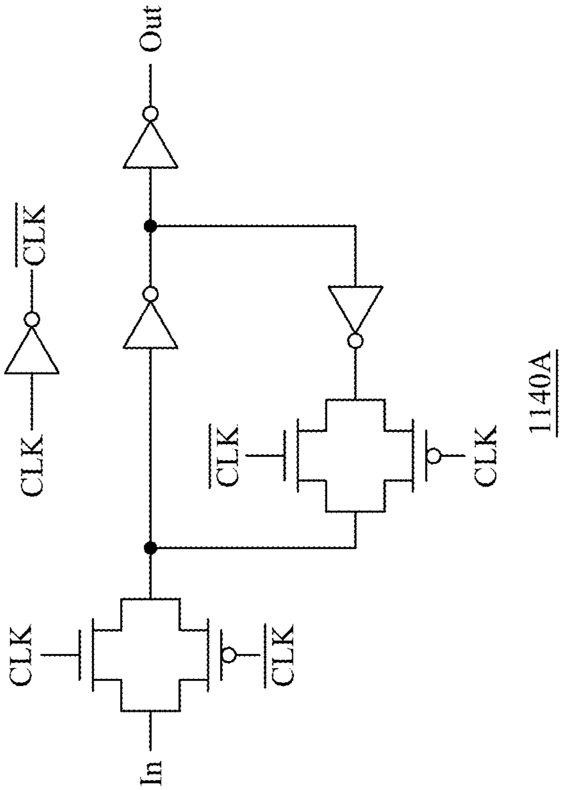
FIG. 11B shows a block diagram of an example circuit, in accordance with some embodiments.
Figure 11A:
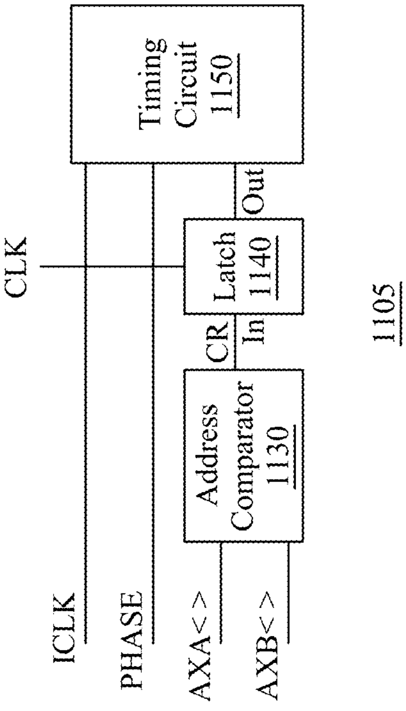
FIG. 11A shows a block diagram of an example circuit, in accordance with some embodiments.

FIG. 11A shows a block diagram of an example circuit, in accordance with some embodiments. More specifically, shown in FIG. 11A is an example memory controller 1105. The memory controller 1105 may be substantially similar to and/or incorporate features of the memory controller 305. The memory controller 1105 can include an address comparator 1130 and a timing circuit 1150, which may be substantially similar to and/or incorporate features of the address comparator 330 and the timing circuit 350, respectively. In some embodiments, the memory controller 1105 can include a latch 1140. Shown in FIG. 11A is a non-limiting example of the memory controller 1105. In some embodiments, the memory controller 1105 can include more, fewer, or different components than shown in or described with respect to FIG. 11A.

The latch 1140 can be operatively coupled between the address comparator 1130 and the timing circuit 1150. The latch 1140 can latch a control signal CR from the address comparator 1130. In some embodiments, the latch 1140 can be configured to receive the control signal CR as an input and latch the control signal CR. In some embodiments, the latch 1140 can be configured to provide an output to the timing circuit 1150. In some embodiments, the latch 1140 can be configured to receive an external clock signal CLK.

FIG. 11B shows a block diagram of an example circuit, in accordance with some embodiments. More specifically, shown in FIG. 11B is a latch 1140A, which is an example of the latch 1140. The latch 1140A can include a transistor, an inverter, etc. to latch the control signal CR from the address comparator 1130. Shown in FIG. 11B is a non-limiting example of the latch 1140. In some embodiments, the latch 1140 can include more, fewer, or different components than shown in or described with respect to FIG. 11B.

Figure 12:
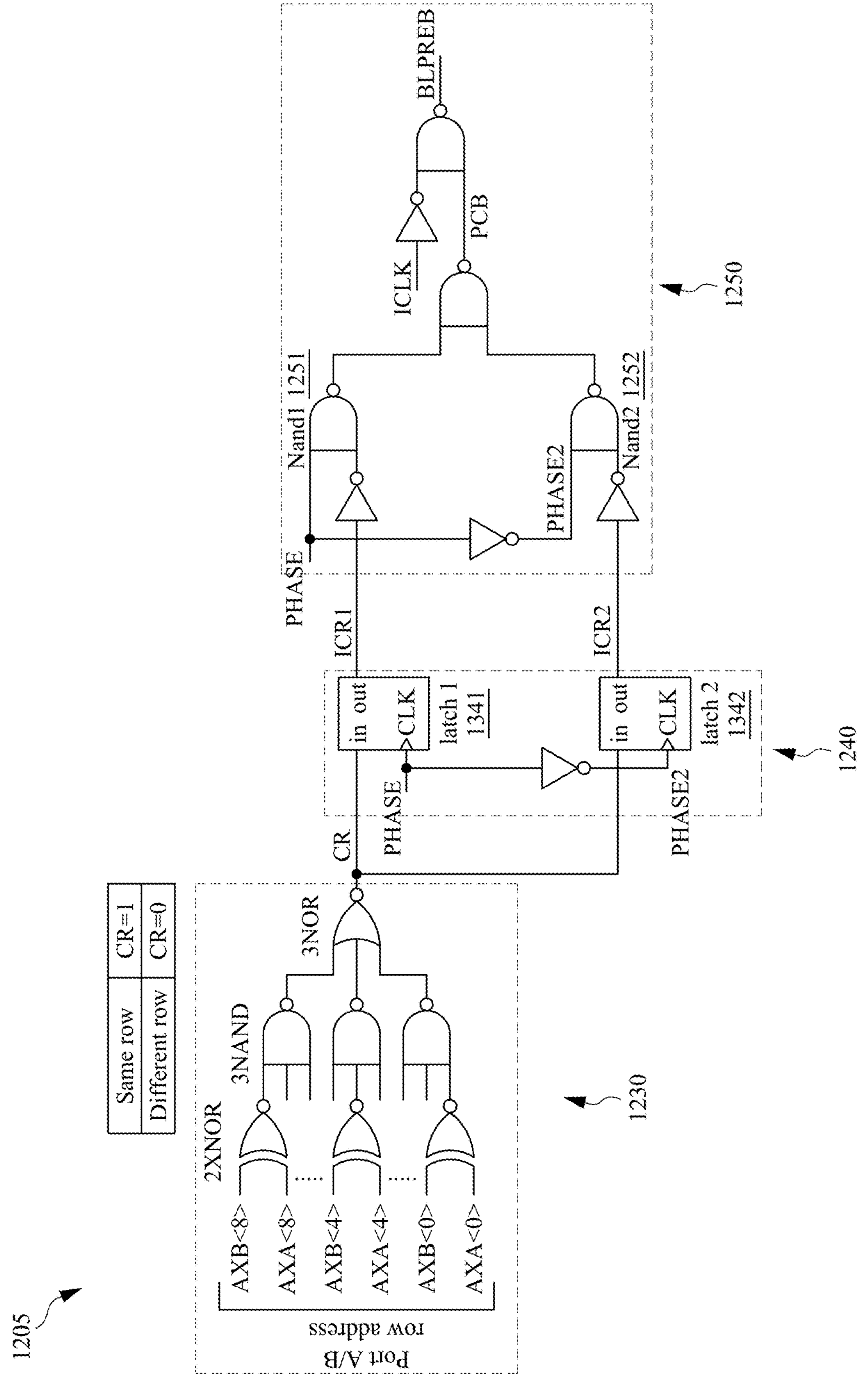
FIG. 12 shows a block diagram of an example circuit, in accordance with some embodiments.

FIG. 12 shows a block diagram of an example circuit, in accordance with some embodiments. More specifically, shown in FIG. 12 is an example memory controller 1205. The memory controller 1205 may be substantially similar to and/or incorporate features of the memory controller 1105. The memory controller 1205 can include an address comparator 1230, a latch circuit 1240, and a timing circuit 1250, which may be substantially similar to and/or incorporate features of the address comparator 1130, the latch 1140, and the timing circuit 1150. In some embodiments, the memory controller 1205 can include more, fewer, or different components than shown in or described with respect to FIG. 12.

The address comparator 1230 can be configured to provide a control signal CR. The control signal CR can be set to a first logic state (e.g., "1") when a first row of a first memory cell indicated by a first address signal AXA is identical to a second row of a second memory cell indicated by a second address signal AXB. The control signal CR can be set to a second logic state (e.g., "0") when a first row of a first memory cell indicated by a first address signal AXA is not identical to a second row of a second memory cell indicated by a second address signal AXB.

A first phase signal PHASE can be provided to the latch circuit 1240 and the timing circuit 1250. The phase signal PHASE can be set to a first logic state (e.g., "1") at the first pre-charging, and can be set to a second logic state (e.g., "0") at the second pre-charging. A second phase signal PHASE2 can be an inverse signal of the first phase signal PHASE. The second phase signal can be set to the second logic state (e.g., "0") at the first pre-charging, and can be set to the first logic state (e.g., "1") at the second pre-charging.

In some embodiments, the first latch 1341 can be configured to hold the control signal CR during a first cycle when the first phase signal has the first logic state (e.g., "1"). For example, the first latch 1341 can be configured to hold the control signal CR during the first pre-charging of a first cycle. In some embodiments, the second latch 1342 can be configured to hold the control signal CR that is provided based on a comparison between the first address signal of a second cycle and the second address signal of the first cycle when the second phase signal PHASE2 has the first logic state (e.g., "1"). For example, the second latch 1342 can be configured to hold the control signal CR during the second pre-charging.

In some embodiments, any signal that can be set to the first logic state (e.g., "1") during the first pre-charging can be used as the first phase signal PHASE. In some embodiments, any signal that can be set to the first logic state (e.g., "1") during the second pre-charging can be used as the second phase signal PHASE2.

In some embodiments, when the first phase signal PHASE is set to the first logic state (e.g., "1"), and an output signal PCB can be a first inverted signal ICR1, an output of a first NAND gate 1251 in the timing circuit 1250 can be set to a first logic state (e.g., "1"), to skip the first pre-charging. In some embodiments, the first latch 1241 can be configured to latch the control signal CR as the first inverted signal ICR1, by the first phase signal PHASE. In some embodiments, when the second phase signal PHASE2 is set to the first logic state (e.g., "1"), and an output signal PCB can be a second inverted signal ICR2, an output of a second NAND gate 1252 in the timing circuit 1250 can be set to a first logic state (e.g., "1"), to skip the second pre-charging. In some embodiments, the second latch 1242 can be configured to latch the control signal CR as the second inverted signal ICR2, by the second phase signal PHASE2.

Figure 13:
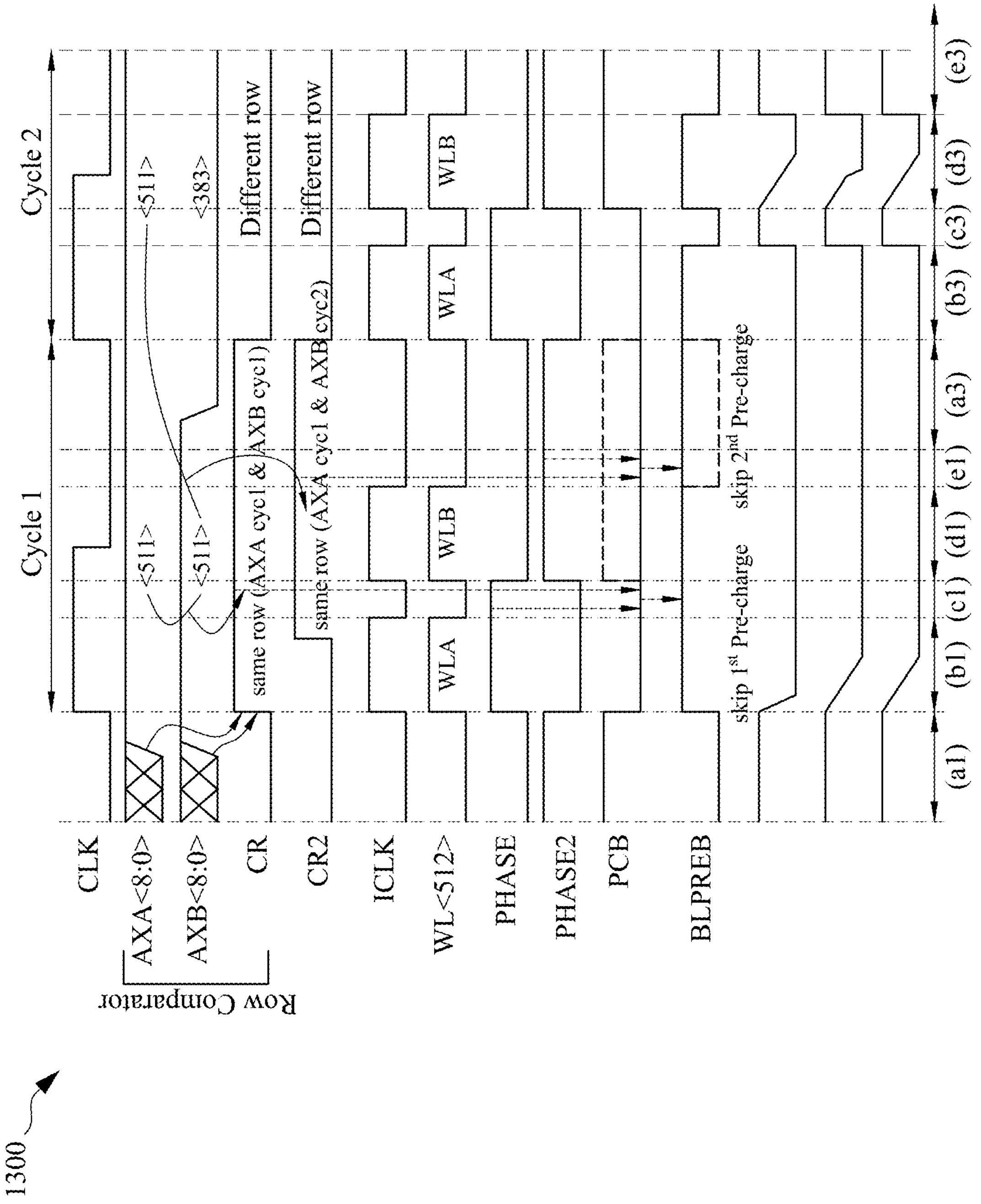
FIG. 13 shows example waveforms associated with a circuit, in accordance with some embodiments.

FIG. 13 shows example waveforms 1300 associated with a circuit, in accordance with some embodiments. In some embodiments, the waveforms 1300 may be associated with operation of the memory controller 305, the memory controller 1105, etc. Shown in FIG. 13 is a non-limiting examples of the waveforms 1300.

The circuit (e.g., the memory controller 305) can operate based on an external clock signal CLK. An address comparator (e.g., the address comparator 330) can receive a first address signal AXA and a second address signal AXB. The address comparator can provide a control signal CR based on a comparison between the first address signal AXA<8:0> and the second address signal AXB<8:0>. A timing circuit (e.g., the timing circuit 350) can receive a logically inverted clock pulse ICLK and a phase signal PHASE. An output PCB can be provided based on a logic operation of the phase signal PHASE and the control signal CR. The timing circuit can provide a pre-charge signal BLPREB based on a logic operation of the output PCB and the logically inverted clock pulse ICLK. The waveforms 1300 include a word line signal WL and a bit line signal BL/BLB (e.g., the first memory cell and the second memory cell in the selected column, and the unselected column).

In some embodiments, a second control signal CR2 can be used to control the pre-charging. When the first address signal AXA and the second address signal AXB indicate a same row, the second control signal CR2 can be provided to identify that the first address signal AXA and the second address signal AXB indicate the same row. The second control signal CR2 can indicate that the first address signal AXA and the second address signal AXB indicate the same row prior to the second pre-charging of the memory cell during the first cycle (Cycle 1).

In some embodiments, a second phase signal PHASE2 can be used to control the pre-charging. The second phase signal PHASE2 can be provided during the first cycle (Cycle 1) to specify the second pre-charging during the first cycle (Cycle 1). At the second pre-charging, the pre-charge control signal BLPREB can be set to a first logic state (e.g., "1") to skip the second pre-charging.

Figure 14:
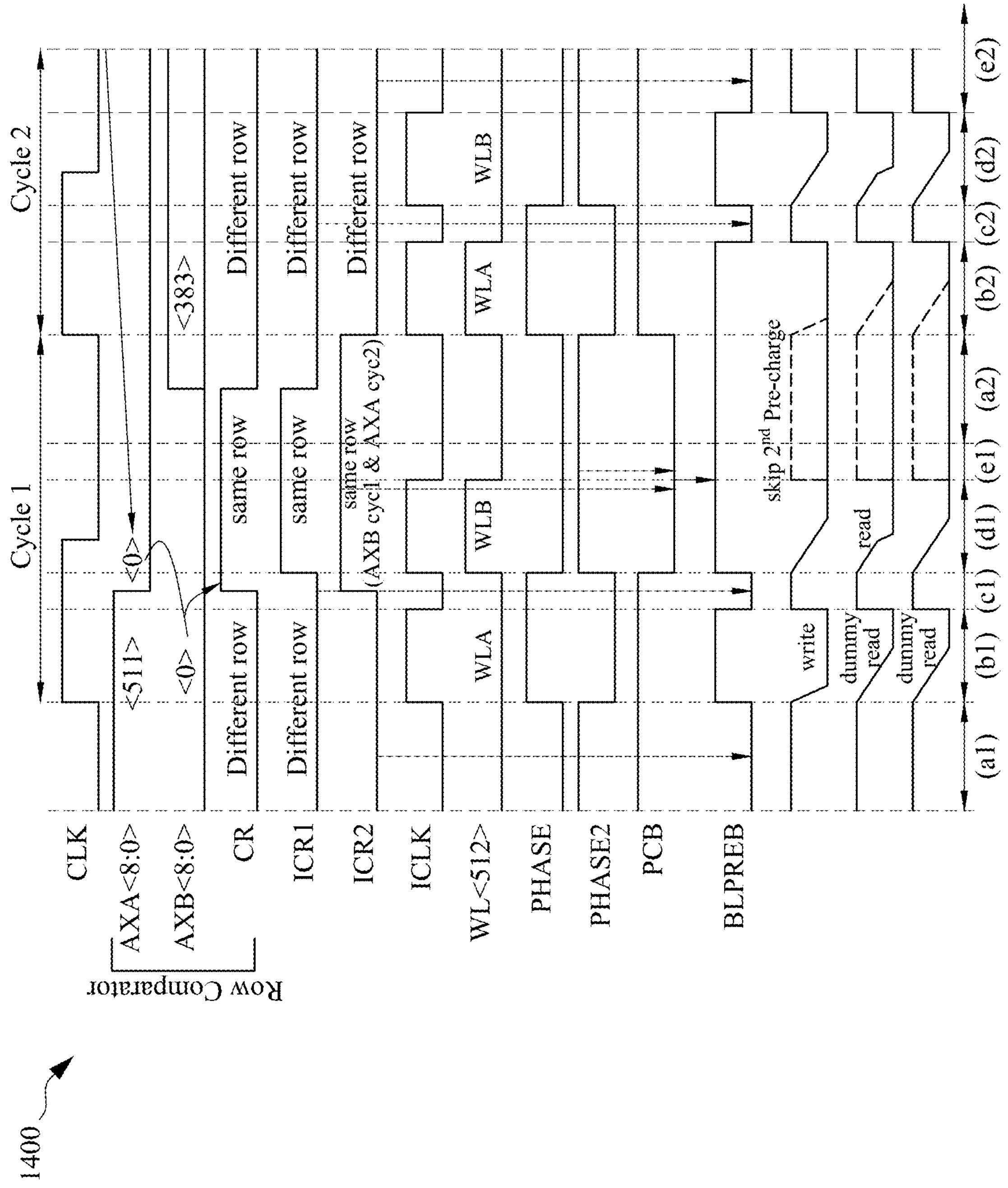
FIG. 14 shows example waveforms associated with a circuit, in accordance with some embodiments.

FIG. 14 shows example waveforms 1400 associated with a circuit, in accordance with some embodiments. In some embodiments, the waveforms 1400 may be associated with operation of the memory controller 305, the memory controller 1105, the memory controller 1205, etc. Shown in FIG. 14 is a non-limiting examples of the waveforms 1400.

An address comparator (e.g., the address comparator 1230) can be configured to provide a control signal CR. The control signal CR can be set to a first logic state (e.g., "1") when a first row of a first memory cell indicated by a first address signal AXA is identical to a second row of a second memory cell indicated by a second address signal AXB. The control signal CR can be set to a second logic state (e.g., "0") when a first row of a first memory cell indicated by a first address signal AXA is not identical to a second row of a second memory cell indicated by a second address signal AXB.

A first phase signal PHASE can be provided to a latch circuit (e.g., the latch 1140) and a timing circuit (e.g., the timing circuit 1150). The phase signal PHASE can be set to a first logic state (e.g., "1") at the first pre-charging, and can be set to a second logic state (e.g., "0") at the second pre-charging. A second phase signal PHASE2 can be an inverse signal of the first phase signal PHASE. The second phase signal PHASE2 can be set to the second logic state (e.g., "0") at the first pre-charging, and can be set to the first logic state (e.g., "1") at the second pre-charging.

In some embodiments, a first latch (e.g., the first latch 1341) can be configured to hold the control signal CR during a first cycle (Cycle 1) when the first phase signal has the first logic state (e.g., "1"). For example, the first latch can be configured to hold the control signal CR during the first pre-charging of the first cycle (Cycle 1). In some embodiments, a second latch (e.g., the second latch 1342) can be configured to hold the control signal CR that is provided based on a comparison between the first address signal AXA of a second cycle (Cycle 2) and the second address signal AXB of the first cycle (Cycle 1) when the second phase signal PHASE2 has the first logic state (e.g., "1"). For example, the second latch can be configured to hold the control signal CR during the second pre-charging.

In some embodiments, any signal that can be set to the first logic state (e.g., "1") during the first pre-charging can be used as the first phase signal PHASE. In some embodiments, any signal that can be set to the first logic state (e.g., "1") during the second pre-charging can be used as the second phase signal PHASE2.

In some embodiments, when the first phase signal PHASE is set to the first logic state (e.g., "1"), and an output signal PCB can be a first inverted signal ICR1, an output of a first NAND gate in the timing circuit can be set to a first logic state (e.g., "1"), to skip the first pre-charging. In some embodiments, the first latch can be configured to latch the control signal CR as the first inverted signal ICR1, by the first phase signal PHASE. In some embodiments, when the second phase signal PHASE2 is set to the first logic state (e.g., "1"), and an output signal PCB can be a second inverted signal ICR2, an output of a second NAND gate in the timing circuit can be set to a first logic state (e.g., "1"), to skip the second pre-charging. In some embodiments, the second latch can be configured to latch the control signal CR as the second inverted signal ICR2, by the second phase signal PHASE2.

In some embodiments, the first latch and the second latch can have different latch clock signals. For example, the first latch can have the first phase signal PHASE as a clock, while the second latch can have the second phase signal PHASE2 as a clock. In some embodiments, the second inverted signal ICR2 can be the latched control signal after changing the first address signal AXA for the second cycle (Cycle 2).

Figure 15:
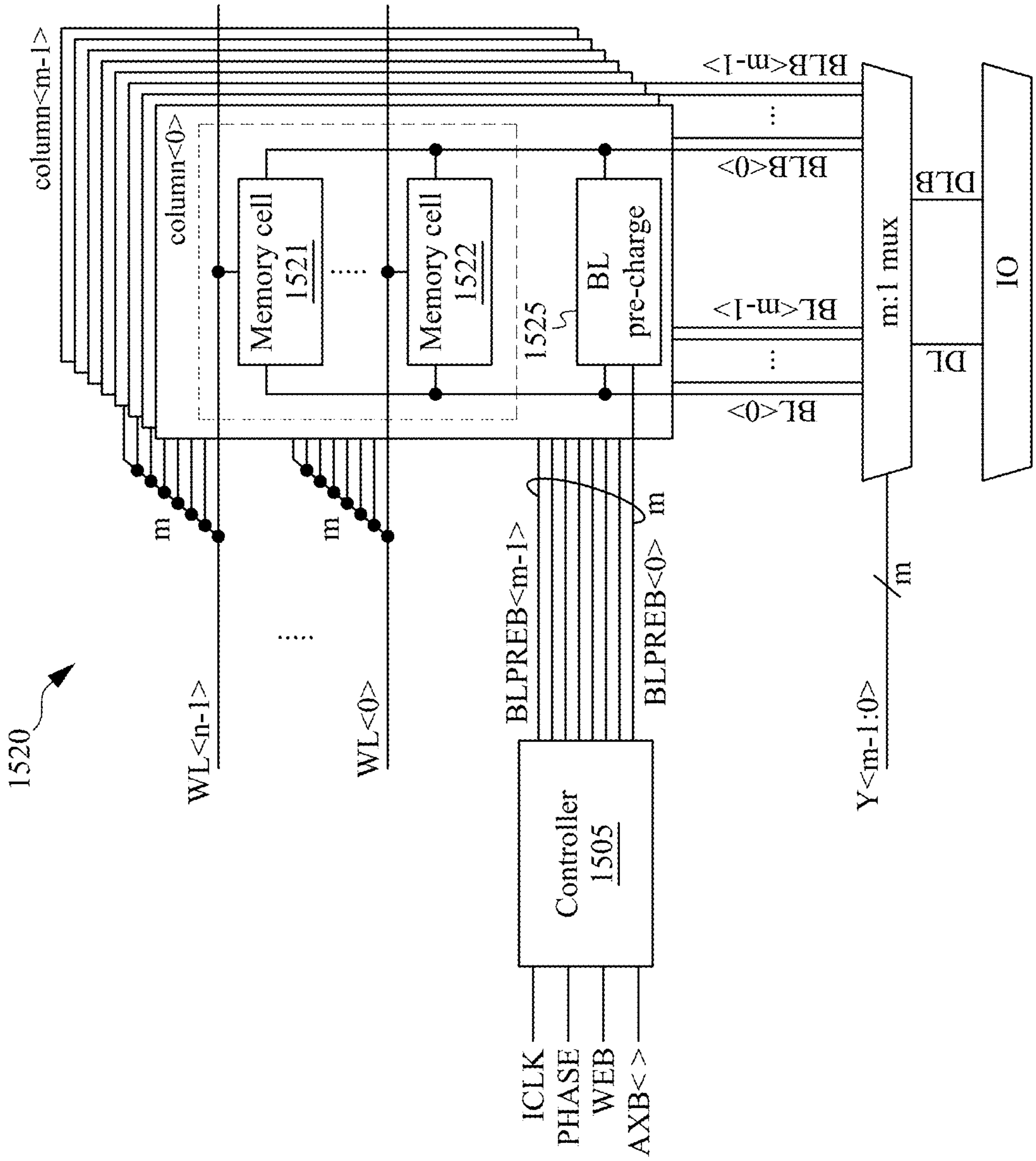
FIG. 15 shows a block diagram of an example circuit, in accordance with some embodiments.

FIG. 15 shows a block diagram of an example circuit, in accordance with some embodiments. More specifically, the circuit shown in FIG. 15 is the memory controller 1505 operably coupled with an example memory circuit 1520. The memory circuit 1520 may be substantially similar to and/or incorporate features of the memory array 120. Shown in FIG. 15 is a non-limiting example of the circuit. In some embodiments, the circuit can include more, fewer, or different components than shown in or described with respect to FIG. 15.

The memory controller 1505 can generate a pre-charge signal BLPREB to control the BL pre-charge circuit of the memory circuit 1520. In some embodiments, the memory controller 1505 can receive a clock pulse ICLK, a phase signal PHASE, a writing enable signal WEB, an address signal AYB, etc. Based on receipt of at least the address signal AYB, the memory controller 1505 can generate the pre-charge signal BLPREB to control the BL pre-charge circuit of the memory circuit 1520, as discussed in detail below. In some embodiments, the pre-charge signal BLPREB can include a plurality of bits (e.g., BLPREB<0>, . . . , BLPREB<m−1>) each corresponding to a logic state. The plurality of bits (e.g., BLPREB<0>, . . . , BLPREB<m−1>) in the pre-charge signal BLPREB can be configured to control the corresponding pre-charge circuit of the respective columns (e.g., column<0>, . . . , column<m−1>).

Figure 16:
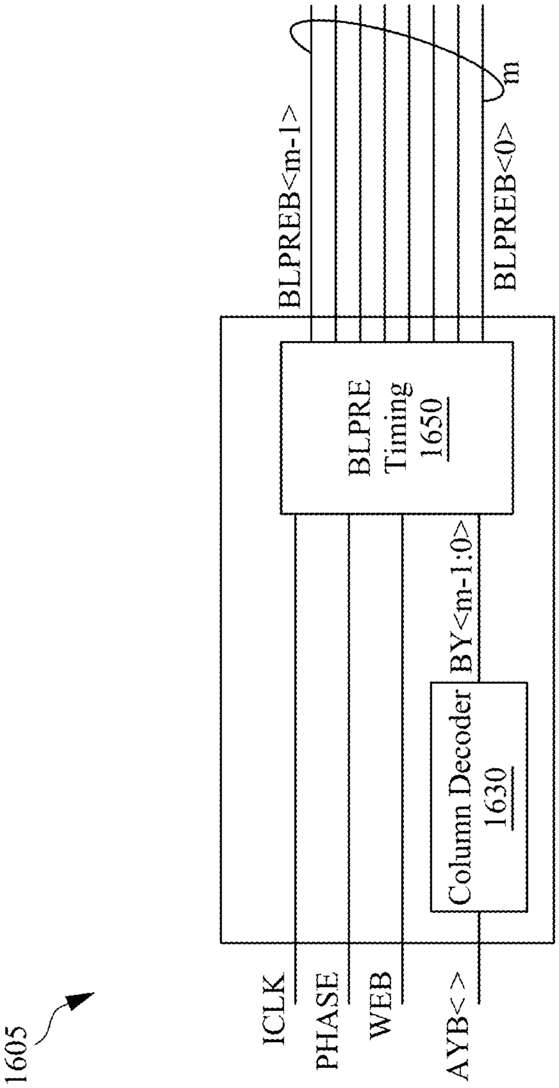
FIG. 16 shows a block diagram of an example circuit, in accordance with some embodiments.

FIG. 16 shows a block diagram of an example circuit, in accordance with some embodiments. More specifically, shown in FIG. 16 is an example memory controller 1605. The memory controller 1605 may be substantially similar to and/or incorporate features of the memory controller 105, the memory controller 305, the memory controller 1505 etc. The memory controller 1605 can include a column decoder 1630 and a timing circuit 1650, which may be substantially similar to and/or incorporate features of the column decoder and the timing circuit, respectively, described with respect to FIG. 1. Shown in FIG. 16 is a non-limiting example of the memory controller 1605. In some embodiments, the memory controller 1605 can include more, fewer, or different components than shown in or described with respect to FIG. 16.

The column decoder 1630 can be configured to receive an address signal AYB. The address signal AXA can, in part, indicate a column address of a memory cell. In some embodiments, the column decoder 1630 can be configured to decode the address signal AYB. Based on a decoding result, the column decoder 1630 can be configured to generate a control signal BY The control signal BY can include the decoding result. In some embodiments, the control signal BY can include a result of exponentiation. For example, when the address signal AYB includes 3 bits (e.g., AYB<2:0>), the control signal BY can include the decoding result including the result of exponentiation (e.g., 23).

The column decoder 1630 can be configured to provide the control signal BY to the timing circuit 1650. The timing circuit 1650 can be configured to receive a clock pulse ICLK, a phase signal PHASE, a write enable signal WEB, and the control signal BY. Based on receipt of at least the control signal BY, the timing circuit 1650 can provide a pre-charge signal BLPREB. The pre-charge signal BLPREB can be configured to skip pre-charging bit lines BLs of a memory cell after accessing the first memory cell, based on a logic state of the control signal BY. In some embodiments, the pre-charge signal BLPREB can include a plurality of logic bits, each corresponding to a corresponding logic state (e.g., BLPREB<0>, . . . , BLPREB<m−1>). In some embodiments, when the writing enable signal WEB includes a first logic state (e.g., “1”), one of the control signal BY can be set to a first logic state (e.g., “1”), and one of the pre-charge signal BLPREB can be set to a first logic state (e.g., 1), thereby stop the BL pre-charging of a selected column corresponding to the address signal AYB.

Figure 17:
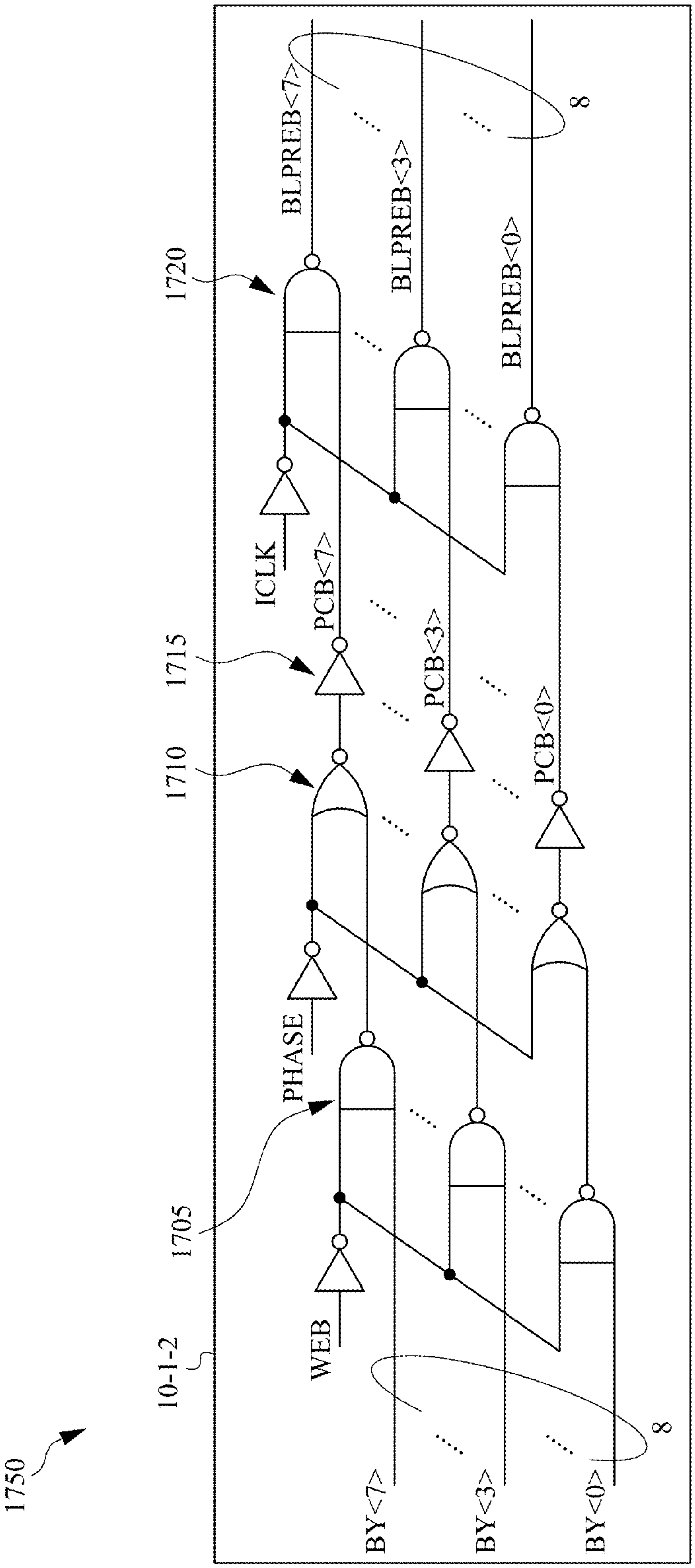
FIG. 17 shows a block diagram of an example circuit, in accordance with some embodiments.

FIG. 17 shows a block diagram of an example circuit, in accordance with some embodiments. More specifically, shown in FIG. 17 is an example timing circuit 1750. Shown in FIG. 17 is a non-limiting example of the timing circuit 1750. In some embodiments, the timing circuit 1750 can include more, fewer, or different components than shown in or described with respect to FIG. 17.

In some embodiments, the timing circuit 1750 can include at least one logic gate. In some embodiments, the timing circuit 1750 can include a plurality of first NAND gates 1705, a plurality of NOR gates 1710, a plurality of inverters 1715, and a plurality of second NAND gates 1720 (the plural number of 8 is shown as a non-limiting example).

In some embodiments, the plurality of first NAND gates 1705 can be configured to receive a control signal BY and a writing enable signal WEB. Based on the control signal BY and the writing enable signal WEB, the plurality of first NAND gates 1705 can be configured to provide an output of NAND operations to the respective ones of the plurality of NOR gates 1710. In some embodiments, the plurality of NOR gates 1710 can be configured to receive the output from the plurality of first NAND gates 1705 and a phase signal PHASE. The plurality of NOR gates 1710 can be configured to provide an output of NOR operations to the respective ones of the plurality of second NAND gates 1720 through the respective inverters 1715. In some embodiments, the plurality of second NAND gates 1720 can be configured to receive the output from the plurality of NOR gates 1710. The plurality of second NAND gates 1720 can be configured to provide a control signal BLPREB as an output.

In some embodiments, the timing circuit 1750 can be configured to control the pre-charging of the bit lines BLs of the memory array. In some embodiments, the pre-charge signal BLPREB can be configured for pre-charging of the bit lines BLs of the memory array (e.g., the memory array 120). For example, the pre-charge signal BLPREB can cause a BL pre-charge circuit (e.g., the BL pre-charge circuit 1525) to pre-charge the bit lines BLs of the memory array. In some embodiments, the pre-charge signal BLPREB can be configured for pre-charging operations. For example, the pre-charge signal BLPREB can cause the BL pre-charge circuit (e.g., the BL pre-charge circuit 1525) to skip the pre-charging of the bit lines BLs of the memory array. In some embodiments, the timing circuit 1750 can be configured to skip pre-charging of the bit lines BLs based on the operation (e.g., read or write). For example, the timing circuit 1750 can be configured to skip pre-charging of the bit lines BLs of a second memory cell (e.g., the second memory cell 1722) after accessing a first memory cell (e.g., the first memory cell 1721), based on an indication of writing operation (e.g., a logic state of “1” in the writing enable signal WEB).

Figure 18:
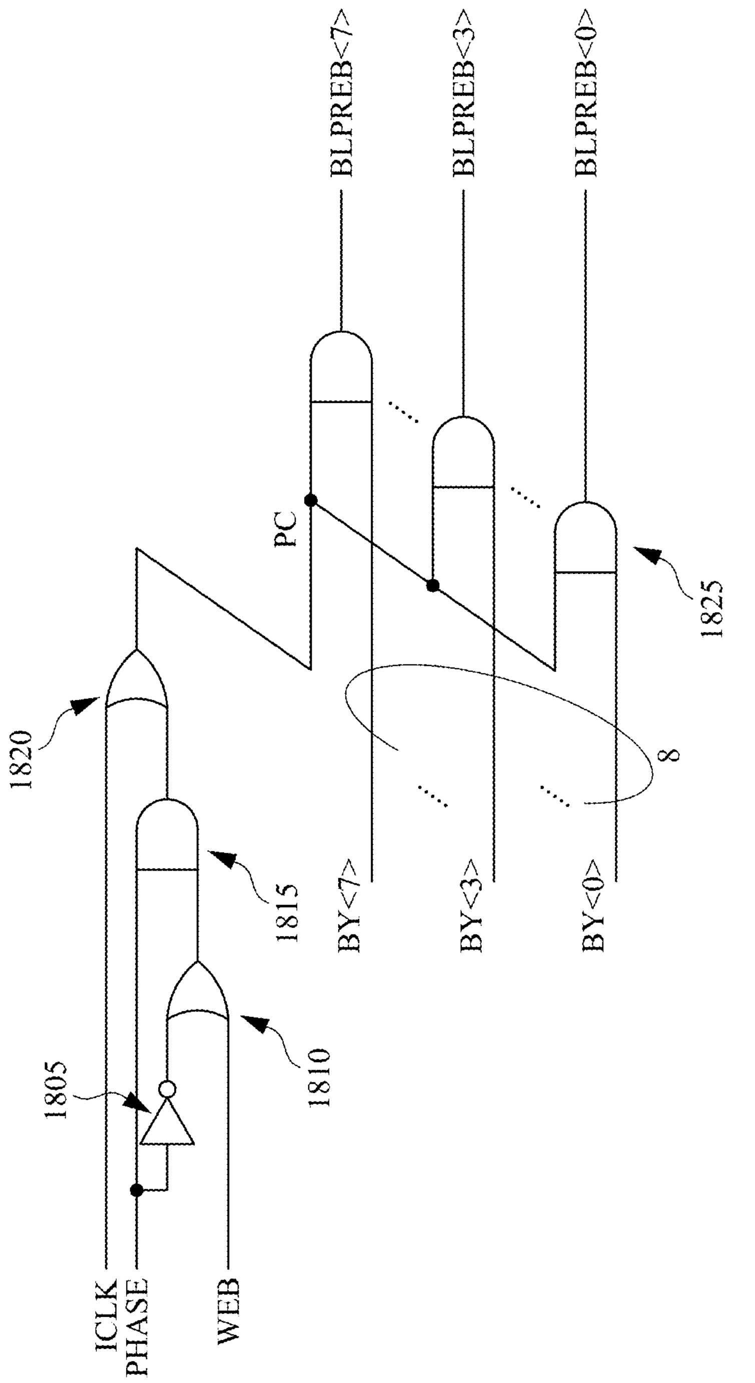
FIG. 18 shows a block diagram of an example circuit, in accordance with some embodiments.

FIG. 18 shows a block diagram of an example circuit, in accordance with some embodiments. More specifically, shown in FIG. 18 is an example timing circuit 1850. Shown in FIG. 18 is a non-limiting example of the timing circuit 1850. In some embodiments, the timing circuit 1850 can include more, fewer, or different components than shown in or described with respect to FIG. 18.

In some embodiments, the timing circuit 1850 can include an inverter 1805, a first OR gate 1810, a first AND gate 1815, a second OR gate 1820, and a plurality of second AND gates 1825. In some embodiments, the first OR gate 1810 can receive a writing enable signal WEB, and a phase signal PHASE through the inverter 1805. The OR gate 1810 can provide an output of OR operation to the first AND gate 1815. In some embodiments, the first AND gate 1815 can be configured to receive the output from the first OR gate 1810 and the phase signal PHASE. The first AND gate 1815 can be configured to provide an output of AND operation to the second OR gate 1820. In some embodiments, the second OR gate 1820 can be configured to receive the output from the first AND gate 1815 and a clock pulse ICLK. The second OR gate 1820 can be configured to provide an output PC of AND operation to the plurality of second AND gates 1820. In some embodiments, the plurality of second AND gates 1825 can be configured to receive the output PC from the second OR gate 1820 and a control signal BY. The plurality of second AND gates 1825 can be configured to provide a pre-charge signal BLPREB based on the output PC and the control signal BY.

In some embodiments, the timing circuit 1850 can be configured to control the pre-charging of the bit lines BLs of the memory array. In some embodiments, the pre-charge signal BLPREB can be configured for pre-charging of the bit lines BLs of the memory array (e.g., the memory array 120). For example, the pre-charge signal BLPREB can cause a BL pre-charge circuit (e.g., the BL pre-charge circuit 1525) to pre-charge the bit lines BLs of the memory array. In some embodiments, the pre-charge signal BLPREB can be configured for pre-charging operations. For example, the pre-charge signal BLPREB can cause the BL pre-charge circuit (e.g., the BL pre-charge circuit 1525) to skip the pre-charging of the bit lines BLs of the memory array. In some embodiments, the timing circuit 1850 can be configured to skip pre-charging of the bit lines BLs based on the operation (e.g., read or write). For example, the timing circuit 1850 can be configured to skip pre-charging of the bit lines BLs of a second memory cell (e.g., the second memory cell 1822) after accessing a first memory cell (e.g., the first memory cell 1821), based on an indication of writing operation (e.g., a logic state of "1" in the writing enable signal WEB).

Figure 19:
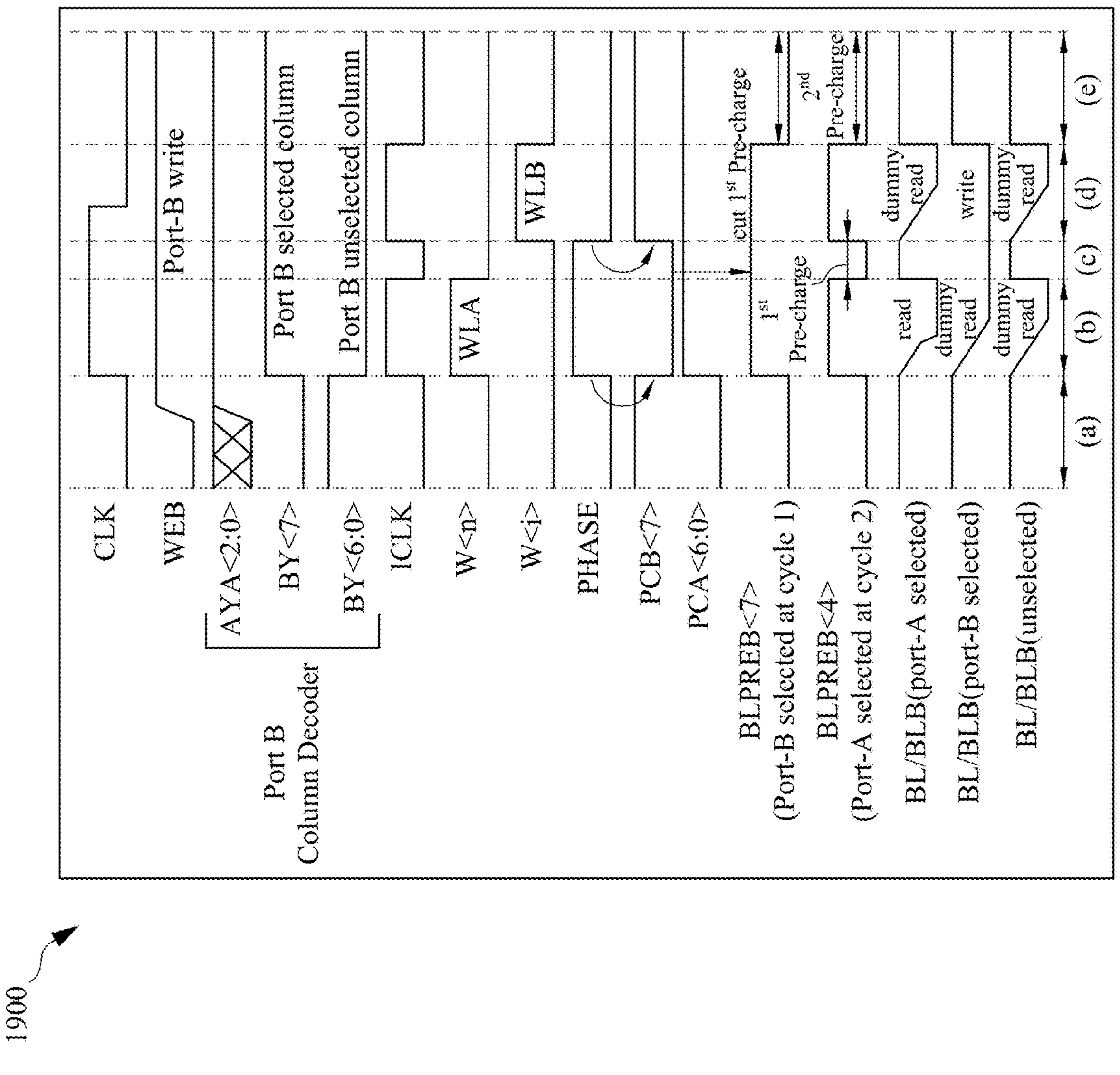
FIG. 19 shows example waveforms associated with a circuit, in accordance with some embodiments.

FIG. 19 shows example waveforms 1900 associated with a circuit, in accordance with some embodiments. In some embodiments, the waveforms 1900 may be associated with operation of the memory controller 1505, the memory controller 1605, etc. Shown in FIG. 19 is a non-limiting examples of the waveforms 1900.

The circuit (e.g., the memory controller 1605) can operate based on an external clock signal CLK. A column decoder (e.g., the column decoder 1630) can receive an address signal AYB. In some embodiments, the address signal AYB can include an address signal for a selected column and an address signal for unselected columns. The column decoder can provide a control signal BY based on a decoding result of the address signal AYB. In some embodiments, the column decoder can provide a control signal BY<7> corresponding to the selected column, and can provide a control signal BY<6:0> corresponding to the unselected columns. A timing circuit (e.g., the timing circuit 1650) can receive a logically inverted clock pulse ICLK, a phase signal PHASE, and a writing enable signal WEB. In some embodiments, the writing enable signal WEB can include a first signal for the selected column, and can include a second signal for the unselected column. The timing circuit can provide an output PCB based on a logic operation of the phase signal PHASE, the clock pulse ICLK, and the writing enable signal WEB. The timing circuit can provide a pre-charge signal BLPREB based on a logic operation of the output PCB and the address signal AYB. The waveforms 1900 include a word line signal WL and a bit line signal BL/BLB.

In period (a), the address signal AYB has 3 bits, each of the bits having a first logic state of "1," which can indicate that the column<7> is selected.

In period (b), when the external clock signal CLK is asserted, the clock pulse ICLK is generated, and a first operation can begin. A word line WL<n> corresponding to the first operation can be asserted in sync with the clock pulse ICLK according to the row address indicated in the address signal AYB. The pre-charge signal BLPREB can be set to a first logic state (e.g., "1") in sync with the clock pulse ICLK. This can stop the BL pre-charging, the selected column can be accessed for the read operation. For the unselected columns, the bit line voltage can drop during the dummy read operation. The column decoder can decode the address signal AYB to set the control signal BY<7> to a first logic state (e.g., "1") for the selected column, and set the control signal BY<6:0> to a second logic state (e.g., "0") for the unselected columns.

In period (c), the clock pulse ICLK is negated. The output PCB<7> for the selected column has a logic state of "0," and the pre-charge signal BLPREB<7> for the selected column can have a logic state of "1," thereby skipping the pre-charging of the bit line in the selected column. The output PCB<6:0> for the unselected column has a logic state of "1," and the pre-charge signal BLPREB<6:0> for the selected column can have a logic state of "1," thereby performing the pre-charging of the bit line in the unselected column.

In period (d), the clock pulse ICLK is asserted again, and a second operation can begin. A word line WL<i> corresponding to the second operation can be asserted in sync with the clock pulse ICLK according to the row address indicated in the address signal AYB. In some embodiments, the first operation and the second operation may select the same row or different rows. The bit line BL for the selected column can maintain the voltage at the end of the first operation because the pre-charging during the first operation is skipped. Since the writing enable signal WEB is set to "1," in the second operation, a write operation can be performed. Thus, the logic state of the bit line BL at the end of the first operation and the memory cell data accessed for the selected column<7> can be different without causing an issue, because the data can be overwritten. For the unselected columns during the second operation, the dummy read operation can be performed, so if the accessed memory cell is different between the first operation and the second operation, a pseudo-write state can occur, and the memory cell data may be overwritten. This does not allow for the pre-charging for the unselected columns to be skipped.

In period (e), the clock pulse ICLK is negated again, and the second operation ends, with the word line WL<i> closed. The pre-charge signal BLPREB can be set to a logic state (e.g., "0") in sync with the clock pulse ICLK, and the second pre-charging can be performed to prepare for the next cycle. If the next operation is a write operation, the 2nd pre-charging for the selected column in the next cycle can be skipped.

Figure 20:
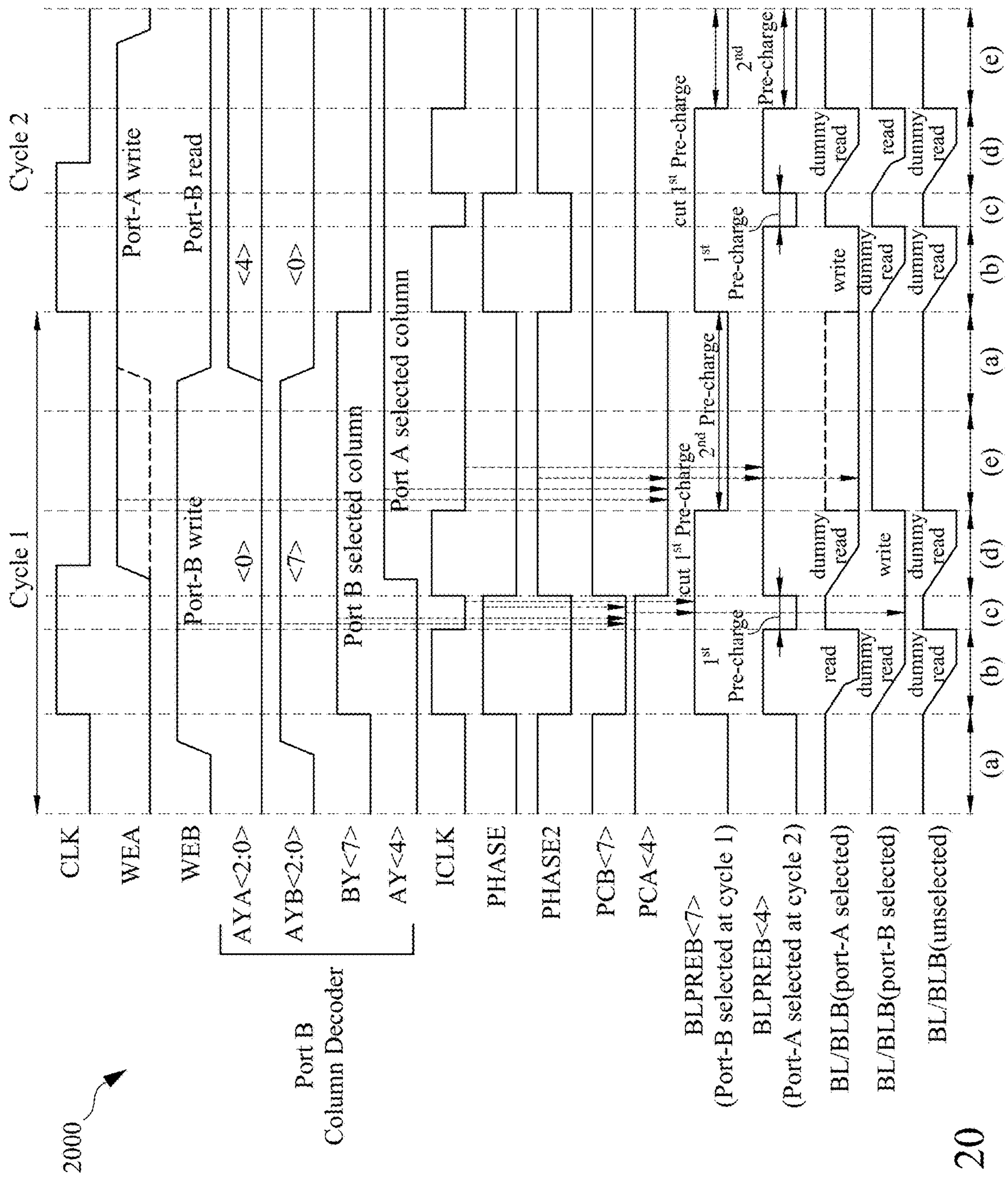
FIG. 20 shows example waveforms associated with a circuit, in accordance with some embodiments.

FIG. 20 shows example waveforms 2000 associated with a circuit, in accordance with some embodiments. In some embodiments, the waveforms 2000 may be associated with operation of the memory controller 1505, the memory controller 1605, etc. Shown in FIG. 20 is a non-limiting examples of the waveforms 2000.

In some embodiments, as shown, the pre-charging can be skipped during two or more successive cycles. The waveforms 2000 include a first cycle (Cycle 1) and a second cycle (Cycle 2), in which the pre-charging can be performed. For example, when the next cycle (Cycle 2) is a write operation, the pre-charging can be performed subsequently. In some embodiments, the decoder can receive the address signal AY<4> prior to the second pre-charging in the first cycle (Cycle 1). In some embodiments, a second phase signal PHASE2 can be used to indicate the second pre-charging during the first cycle. In some embodiments, the output PCA<4> can be set to a logic state (e.g., "0") at the second pre-charging of the first cycle, thereby keeping the pre-charge signal BLPREB<4> at a first logic state, "1." Thus, the pre-charging of the bit line BL/BLB<4> can be skipped during the second pre-charging of the first cycle.

Figure 21:
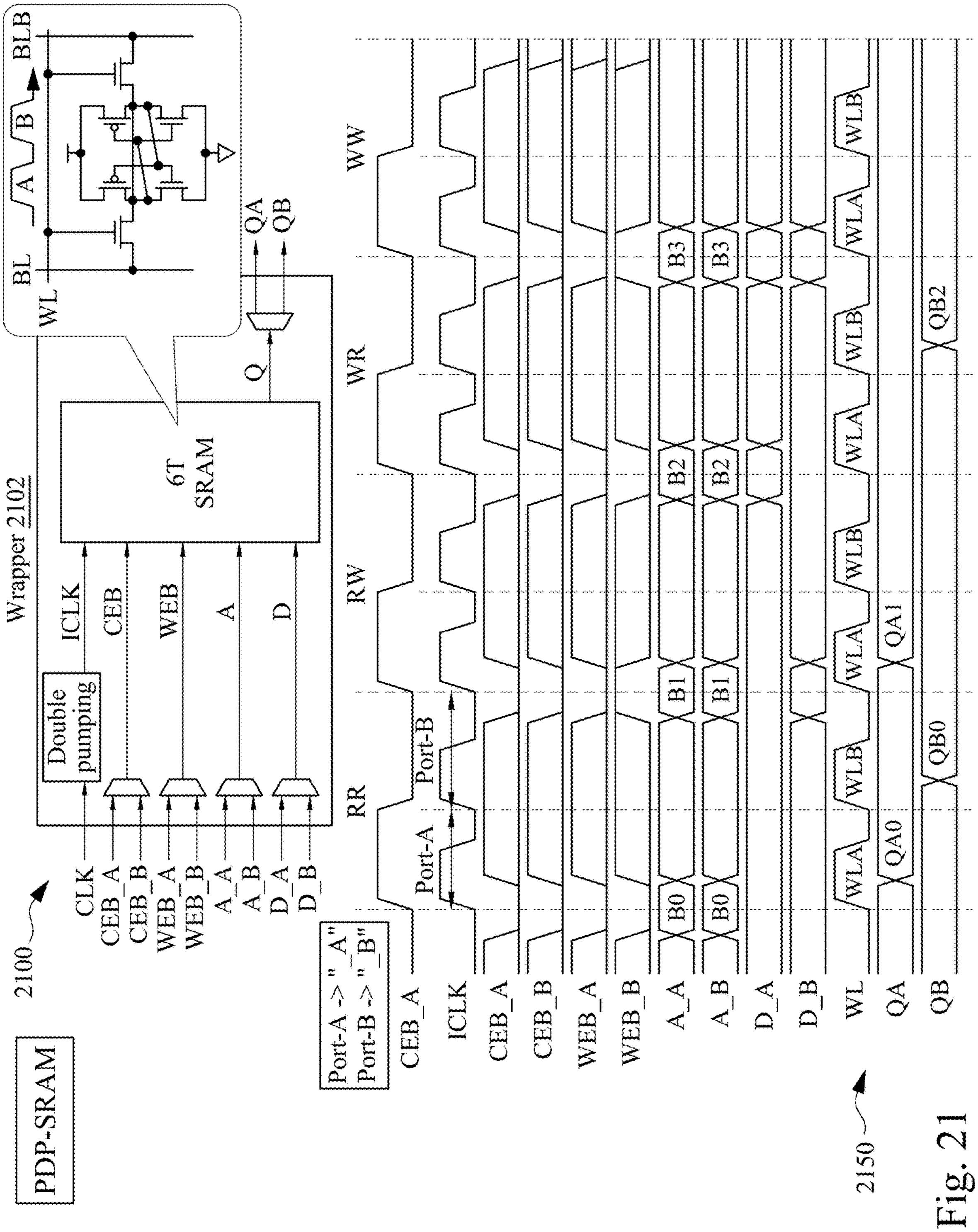
FIG. 21 shows a block diagram of an example circuit and associated waveforms, in accordance with some embodiments.

FIG. 21 shows a block diagram of an example circuit and associated waveforms, in accordance with some embodiments. More specifically, shown in FIG. 21 is an example six-transistor (6T) static random access memory (SRAM) cell 2100 and associated timing chart 2150. Shown in FIG. 21 is a non-limiting example, and the 6T SRAM 2100 can include more, fewer, or different components than shown in or described with respect to FIG. 21.

In some embodiments, the memory cells of the memory array disclosed herein can include the 6T SRAM 2100. For example, the circuits and operations discussed with respect to FIG. 1 to FIG. 20 may include the 6T SRAM 2100 and operations thereof.

In some embodiments, the 6T SRAM 2100 can include a first port (Port-A) and a second port (Port-B). Referring to FIG. 21, operations associated with the first port A is referred to as "_A," and operations associated with the first port B is referred to as "_B."

In some embodiments, the 6T SRAM 2100 can operate with a single clock signal CLK. For example, the operation for the first port Port-A and the operation for the second port Port-B can be performed sequentially within one single clock signal CLK. In some embodiments, the 6T SRAM 2100 can be included within or operably coupled with a wrapper circuit 2102 configured to switch the operations between the first port Port-A and the second port Port-B. In some embodiments, when the clock signal CLK is set to a first logic state (e.g., "1"), a clock pulse ICLK can be generated two times for the first port Port-A and the second port Port-B.

In some embodiments, during a phase for the first port Port-A, an input can be input to the 6T SRAM 2100 through the first port Port-A (e.g., the input A from the input A_A, the input D from the input D_A). During a phase for the second port Port-B, an input can be input to the 6T SRAM 2100 through the second port Port-B (e.g., the input A from the input A_B, the input D from the input D_B). In some embodiments, the 6T SRAM 2100 can perform various operations, including RR, RW, WR, and WW operations (where "R" stands for "Read" and "W" stands for "Write").

Figure 22:
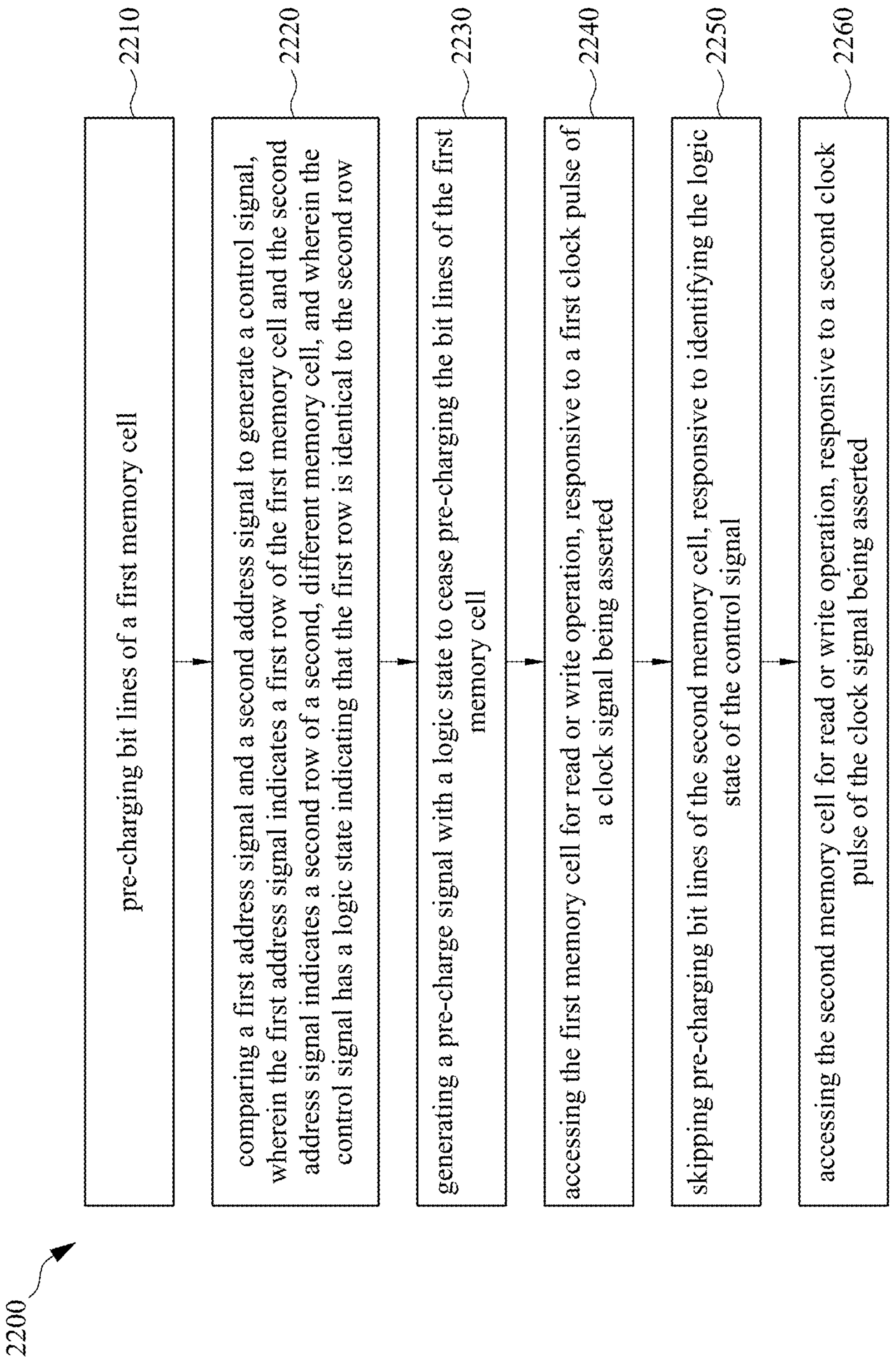
FIG. 22 shows a flowchart of a method to operate a circuit, in accordance with some embodiments.

FIG. 22 illustrates a flowchart of a method 2200 to operate a memory system, in accordance with some embodiments. It is noted that the method 2200 is merely an example and is not intended to limit the present disclosure. Accordingly, it is understood that additional, fewer, or different operations may be in the method 2200 of FIG. 22, additional operations provided before, during, and after the method 2200 of FIG. 22, and that some other operations may only be briefly described herein. In some embodiments, the method 2200 is performed by a circuit (e.g., the memory controller 105, the memory controller 305, etc.).

In a brief overview, the method 2200 can start with operation 2210 of pre-charging bit lines of a first memory cell. The method 2200 can continue to operation 2220 of comparing a first address signal and a second address signal to generate a control signal, wherein the first address signal indicates a first row of the first memory cell and the second address signal indicates a second row of a second, different memory cell, and wherein the control signal has a logic state indicating that the first row is identical to the second row. The method 2200 can continue to operation 2230 of generating a pre-charge signal with a logic state to cease pre-charging the bit lines of the first memory cell. The method 2200 can continue to operation 2240 of accessing the first memory cell for read or write operation, responsive to a first clock pulse of a clock signal being asserted. The method 2200 can continue to operation 2250 of skipping pre-charging bit lines of the second memory cell, responsive to identifying the logic state of the control signal. The method 2200 can continue to operation 2260 of accessing the second memory cell for read or write operation, responsive to a second clock pulse of the clock signal being asserted.

The method 2200 can start with operation 2210 of pre-charging bit lines of a first memory cell. The method 2200 can continue to operation 2220 of comparing a first address signal and a second address signal to generate a control signal, wherein the first address signal indicates a first row of the first memory cell and the second address signal indicates a second row of a second, different memory cell, and wherein the control signal has a logic state indicating that the first row is identical to the second row. An address comparator (e.g., the address comparator 330) can compare a first address signal (e.g., the first address signal AXA) and a second address signal (e.g., the second address signal AXB) to generate a control signal (e.g., the control signal CR). The control signal can have a first logic state (e.g., 1) indicating that the first row is identical to the second row.

The method 2200 can continue to operation 2230 of generating a pre-charge signal with a logic state to cease pre-charging the bit lines of the first memory cell (e.g., the first memory cell 221). A timing circuit (e.g., the timing circuit 350) can be configured to generate the pre-charge signal (e.g., the pre-charge signal BLPREB) to cease pre-charging the bit lines of the first memory cell.

The method 2200 can continue to operation 2240 of accessing the first memory cell for read or write operation, responsive to a first clock pulse of a clock signal being asserted. The method 2200 can continue to operation 2250 of skipping pre-charging bit lines of the second memory cell (e.g., the second memory cell 222), responsive to identifying the logic state of the control signal. The method 2200 can continue to operation 2260 of accessing the second memory cell for read or write operation, responsive to a second clock pulse of the clock signal being asserted.

Figure 23:
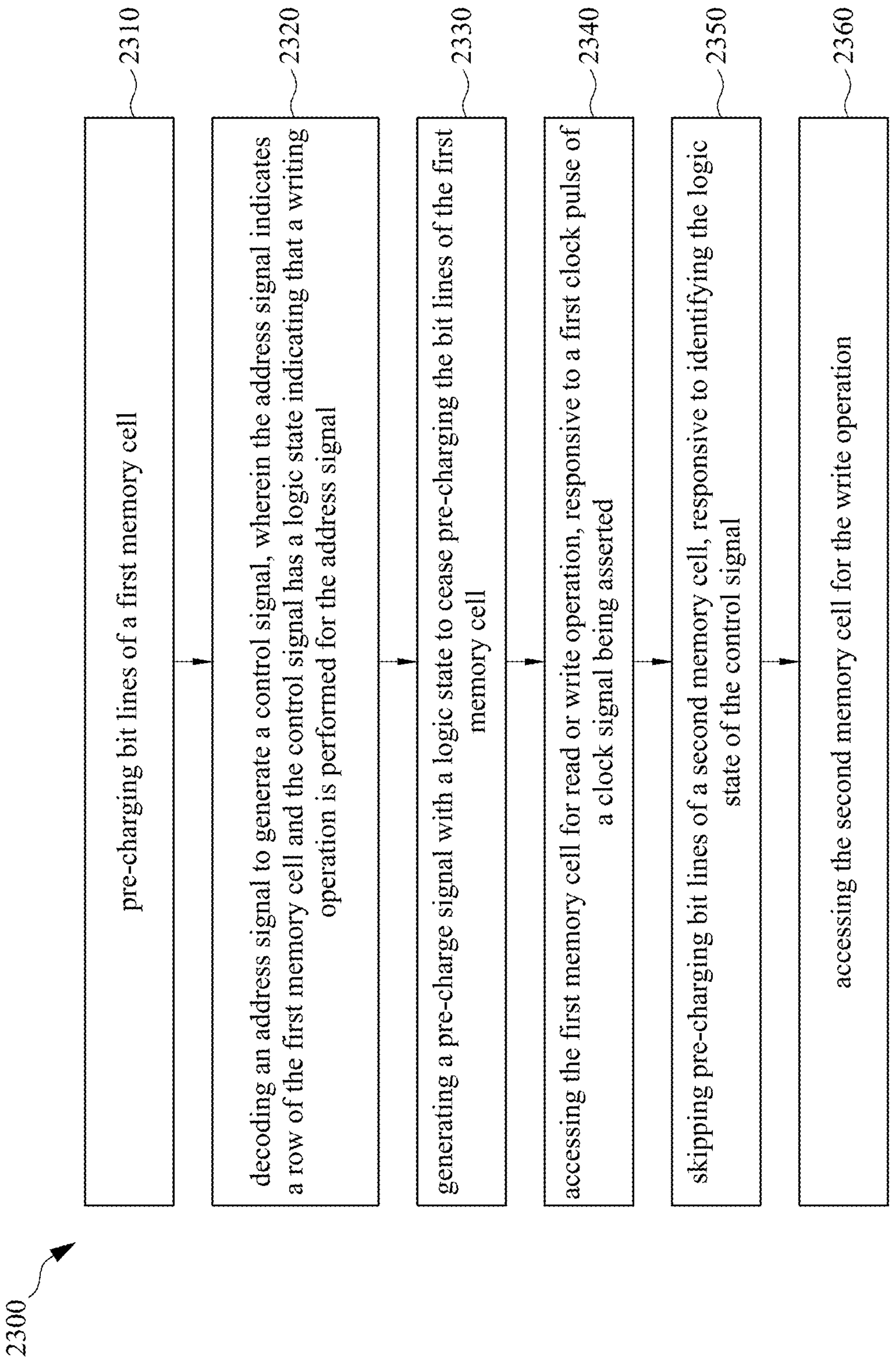
FIG. 23 shows a flowchart of a method to operate a circuit, in accordance with some embodiments.

FIG. 23 illustrates a flowchart of a method 2300 to operate a memory system, in accordance with some embodiments. It is noted that the method 2300 is merely an example and is not intended to limit the present disclosure. Accordingly, it is understood that additional, fewer, or different operations may be in the method 2300 of FIG. 23, additional operations provided before, during, and after the method 2300 of FIG. 23, and that some other operations may only be briefly described herein. In some embodiments, the method 2300 is performed by a circuit (e.g., the memory controller 105, the memory controller 1605, etc.).

In a brief overview, the method 2300 can start with operation 2310 of pre-charging bit lines of a first memory cell. The method 2300 can continue to operation 2320 of decoding an address signal to generate a control signal, wherein the address signal indicates a row of the first memory cell and the control signal has a logic state indicating that a writing operation is performed for the address signal. The method 2300 can continue to operation 2330 of generating a pre-charge signal with a logic state to cease pre-charging the bit lines of the first memory cell. The method 2300 can continue to operation 2340 of accessing the first memory cell for read or write operation, responsive to a first clock pulse of a clock signal being asserted. The method 2300 can continue to operation 2350 of skipping pre-charging bit lines of a second memory cell, responsive to identifying the logic state of the control signal. The method 2300 can continue to operation 2360 of accessing the second memory cell for the write operation.

The method 2300 can start with operation 2310 of pre-charging bit lines of a first memory cell (e.g., the first memory cell 221). The method 2300 can continue to operation 2320 of decoding an address signal (e.g., the address signal AYB) to generate a control signal (e.g., the control signal BY), wherein the address signal indicates a row of the first memory cell and the control signal has a logic state indicating that a writing operation is performed for the address signal. A column decoder (e.g., the column decoder 1630) can decode the address signal to generate the control signal. The column decoder can provide a decoded result including bit data indicating whether a writing operation is performed for the address signal.

The method 2300 can continue to operation 2330 of generating a pre-charge signal (e.g., the pre-charge signal BLPREB) with a logic state to cease pre-charging the bit lines of the first memory cell. A timing circuit (e.g., the timing circuit 1650) can be configured to generate the pre-charge signal. The method 2300 can continue to operation 2340 of accessing the first memory cell for read or write operation, responsive to a first clock pulse of a clock signal being asserted. The method 2300 can continue to operation 2350 of skipping pre-charging bit lines of a second memory cell, responsive to identifying the logic state of the control signal. The method 2300 can continue to operation 2360 of accessing the second memory cell for the write operation.

One aspect of this description relates to a memory circuit. The memory circuit includes a memory array including a plurality of memory cells, wherein each of the plurality of memory cells is accessible through a plurality of bit lines, a comparator configured to receive a first address signal indicating a first row along which a first one of the memory cells is disposed and a second address signal indicating a second row along which a second one of the memory cells is disposed, and generate a control signal with a logic state indicating whether the first row is identical to the second row, a timing circuit configured to skip pre-charging the bit lines of the second memory cell after accessing the first memory cell, based on the logic state of the control signal.

One aspect of this description relates a memory circuit. The memory circuit includes a comparator configured to compare a first address signal with a second address signal so as to generate a control signal, wherein the first address signal, in part, indicates a first row of a first memory cell and the second address signal, in part, indicates a second row of a second memory cell, and wherein the control signal has a logic state indicating whether the first row is identical to the second row, and a timing circuit configured to skip pre-charging bit lines of the second memory cell after accessing the first memory cell, based on the logic state of the control signal.

One aspect of this description relates to a method for operating a memory circuit. The method includes pre-charging bit lines of a first memory cell, comparing a first address signal and a second address signal to generate a control signal, wherein the first address signal indicates a first row of the first memory cell and the second address signal indicates a second row of a second, different memory cell, and wherein the control signal has a logic state indicating that the first row is identical to the second row, generating a pre-charge signal with a logic state to cease pre-charging the bit lines of the first memory cell, accessing the first memory cell for read or write operation, responsive to a first clock pulse of a clock signal being asserted, skipping pre-charging bit lines of the second memory cell, responsive to identifying the logic state of the control signal, and accessing the second memory cell for read or write operation, responsive to a second clock pulse of the clock signal being asserted.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:

a memory array including a plurality of memory cells, wherein each of the plurality of memory cells is accessible through a plurality of bit lines;

a comparator configured to receive a first address signal indicating a first row along which a first one of the memory cells is disposed and a second address signal indicating a second row along which a second one of the memory cells is disposed, and generate a control signal with a logic state indicating whether the first row is identical to the second row;

a timing circuit configured to skip pre-charging the bit lines of the second memory cell after accessing the first memory cell, based on the logic state of the control signal.

2. The memory circuit of claim 1, wherein the first memory cell is first accessed based on asserting a first clock pulse, and the second memory cell is then accessed based on asserting a second clock pulse.

3. The memory circuit of claim 2, wherein the first clock pulse and the second clock pulse are within one clock cycle.

4. The memory circuit of claim 1, wherein the comparator includes a plurality of first XNOR gates each with 2 inputs, a plurality of NAND gates each with 3 inputs, and a second NOR gate with 3 inputs.

5. The memory circuit of claim 1, wherein the comparator includes a plurality of XOR gates each with 2 inputs, one inverter, and a plurality of n-type transistors.

6. The memory circuit of claim 1, wherein the timing circuit includes a first NAND gate and a second NAND gate.

7. The memory circuit of claim 6, wherein the first NAND gate is configured to receive the control signal and a phase signal so as to provide an output, and the second NAND gate is configured to receive the output and a logically inverted clock pulse so as to provide a pre-charge signal configured for pre-charging the bit lines of the memory array.

8. The memory circuit of claim 7, wherein the phase signal transitions between different logic states when accessing respective memory cells of the memory array.

9. The memory circuit of claim 1, further comprising a latch operatively coupled between the comparator and the timing circuit.

10. The memory circuit of claim 1, wherein each of the memory cells includes a six-transistor static random access memory (SRAM) cell.

11. A memory circuit, comprising:

a comparator configured to compare a first address signal with a second address signal so as to generate a control signal, wherein the first address signal, in part, indicates a first row of a first memory cell and the second address signal, in part, indicates a second row of a second memory cell, and wherein the control signal has a logic state indicating whether the first row is identical to the second row; and a timing circuit configured to skip pre-charging bit lines of the second memory cell after accessing the first memory cell, based on the logic state of the control signal.

12. The memory circuit of claim 11, wherein, during a first cycle of a clock signal in which the first and second memory cells are sequentially accessed, the timing circuit is configured to:

before accessing the first memory cell, generate a pre-charge signal with a first logic state to pre-charge bit lines of the first memory cell before accessing the first memory cell;

after accessing the first memory cell, generate the pre-charge signal with a second logic state to skip pre-charging the bit lines of the second memory cell, responsive to receiving the logic state of the control signal indicating that the first row is identical to the second row.

13. The memory circuit of claim 12, wherein the first memory cell is accessed based on a first clock pulse within the first cycle of the clock signal, and the second memory cell is accessed based on a second clock pulse within the first cycle of the clock signal.

14. The memory circuit of claim 12, wherein, during the first cycle of the clock signal, the timing circuit is configured to:

after accessing the second memory cell, generate the pre-charge signal with the second logic state to again skip pre-charging bit lines of a third memory cell that is configured to be accessed during a second, subsequent cycle of the clock signal, responsive to receiving the logic state of the control signal indicating that the second row is identical to a third row of the third memory cell.

15. The memory circuit of claim 11, wherein the comparator includes a plurality of first XNOR gates each with 2 inputs, a plurality of NAND gates each with 3 inputs, and a second NOR gate with 3 inputs.

16. The memory circuit of claim 11, wherein the comparator includes a plurality of XOR gates each with 2 inputs, one inverter, and a plurality of n-type transistors.

17. The memory circuit of claim 11, further comprising a latch operatively coupled between the comparator and the timing circuit.

18. The memory circuit of claim 11, wherein the timing circuit includes a first NAND gate configured to receive the control signal and provide an output, and a second NAND gate configured to receive the output and provide a pre-charge signal.

19. A method for operating a memory circuit, comprising:

pre-charging bit lines of a first memory cell;

comparing a first address signal and a second address signal to generate a control signal, wherein the first address signal indicates a first row of the first memory cell and the second address signal indicates a second row of a second, different memory cell, and wherein the control signal has a logic state indicating that the first row is identical to the second row;

generating a pre-charge signal with a logic state to cease pre-charging the bit lines of the first memory cell;

accessing the first memory cell for read or write operation, responsive to a first clock pulse of a clock signal being asserted;

skipping pre-charging bit lines of the second memory cell, responsive to identifying the logic state of the control signal; and accessing the second memory cell for read or write operation, responsive to a second clock pulse of the clock signal being asserted.

20. The method of claim 19, wherein the first memory cell includes a six-transistor static random access memory (SRAM) cell.

* * * * *